United States Patent
Hong et al.

(10) Patent No.: US 8,357,922 B2
(45) Date of Patent: Jan. 22, 2013

(54) NANODEVICE, TRANSISTOR COMPRISING THE NANODEVICE, METHOD FOR MANUFACTURING THE NANODEVICE, AND METHOD FOR MANUFACTURING THE TRANSISTOR

(75) Inventors: Young-Joon Hong, Yongin-shi (KR); Gyu-Chul Yi, Pohang (KR)

(73) Assignee: LG Display Co., Ltd., Seoul (KR)

( * ) Notice: Subject to any disclaimer, the term of this patent is extended or adjusted under 35 U.S.C. 154(b) by 129 days.

(21) Appl. No.: 12/866,208

(22) PCT Filed: Feb. 5, 2008

(86) PCT No.: PCT/KR2008/000731
§ 371 (c)(1),
(2), (4) Date: Aug. 4, 2010

(87) PCT Pub. No.: WO2009/099259
PCT Pub. Date: Aug. 13, 2009

(65) Prior Publication Data
US 2011/0017973 A1    Jan. 27, 2011

(30) Foreign Application Priority Data

Feb. 4, 2008  (KR) .................. 10-2008-0011398

(51) Int. Cl.
*H01L 29/06* (2006.01)
*H01L 21/20* (2006.01)

(52) U.S. Cl. ............. 257/9; 257/E33.019; 257/E33.008; 257/E29.072; 438/478; 977/732; 977/762

(58) Field of Classification Search .................. 257/13, 257/12, 9, E29.072, E33.019, E33.008; 977/762, 977/701, 707, 720, 932; 438/478, 268, 172
See application file for complete search history.

(56) References Cited

U.S. PATENT DOCUMENTS

| | | | |
|---|---|---|---|
| 6,566,704 B2 | 5/2003 | Choi et al. | |
| 6,809,351 B2 | 10/2004 | Kuramoto et al. | |
| 6,815,294 B2 | 11/2004 | Choi et al. | |
| 6,833,567 B2 | 12/2004 | Choi et al. | |
| 6,930,343 B2 | 8/2005 | Choi et al. | |
| 2004/0175844 A1 | 9/2004 | Yang et al. | |
| 2005/0082543 A1* | 4/2005 | Alizadeh et al. | 257/79 |
| 2006/0192231 A1* | 8/2006 | Nihei | 257/260 |
| 2006/0205105 A1 | 9/2006 | Maruyama et al. | |
| 2007/0243787 A1* | 10/2007 | Pan et al. | 445/49 |
| 2008/0107876 A1* | 5/2008 | Yi et al. | 428/201 |
| 2008/0169019 A1* | 7/2008 | Korevaar et al. | 136/251 |

FOREIGN PATENT DOCUMENTS

| | | | |
|---|---|---|---|
| EP | 1 420 414 A1 | 5/2004 | |
| JP | 2002270516 | 9/2002 | |
| JP | 2003031520 | 1/2003 | |
| KR | 102002000126 | 1/2002 | |
| KR | 10-2006-0027425 | * 10/2007 | |
| WO | WO 2007/145406 A1 | 12/2007 | |

* cited by examiner

*Primary Examiner* — A. Sefer
*Assistant Examiner* — Nikolay Yushin
(74) *Attorney, Agent, or Firm* — Birch, Stewart, Kolasch & Birch, LLP

(57) ABSTRACT

A nanodevice, a transistor including the nanodevice, a method of manufacturing the nanodevice, and a method of manufacturing the transistor including the nanodevice are provided. The nanodevice includes a substrate, a mask layer located on the substrate and having at least one opening, and a nanotube formed on the substrate through the opening along an edge of the opening. The nanotube extends through the opening in a direction substantially perpendicular to a surface of the substrate.

25 Claims, 35 Drawing Sheets

NANODEVICE, TRANSISTOR COMPRISING THE NANODEVICE, METHOD FOR MANUFACTURING THE NANODEVICE, AND METHOD FOR MANUFACTURING THE TRANSISTOR

TECHNICAL FIELD

The present invention relates to a nanodevice, a transistor including the nanodevice, a method for manufacturing the nanodevice, and a method for manufacturing the transistor. More particularly, the present invention relates to a nanodevice including a nanotube or a nanowall formed to have a desired shape at a desired position by using a pattern formed on a substrate, a transistor including the nanodevice, a method for manufacturing the nanodevice, and a method for manufacturing the transistor.

BACKGROUND ART

A method of manufacturing a nanostructure by using a bottom-up process attracts considerable attention. The nanostructure grows in the bottom-up process such that it has a high crystalline structure and a low dislocation density. Thus, a crystalline characteristic of the nanostructure is superior to a nanostructure formed by a top-down cutting process using photolithography. As a result, the nanostructure formed using the bottom-up process has superior electrical and optical properties to those of the nanostructure formed by the top-down cutting process. The nanostructure may be a nanoparticle having a zero-dimensional structure, a nanobar having a one-dimensional structure, and a nanowall having a two-dimensional structure. For example, a graphene (i.e., a carbon monolayer) is a two-dimensional nanostructure.

Here, the two-dimensional structure has a larger surface area than that of the nanoparticle and nanobar. In addition, an aspect ratio of the two-dimensional structure is large. Thus, control of the two-dimensional structure may be easier than for the one-dimensional structure. However, it is difficult to form the two-dimensional nanostructure to have a desired shape.

DISCLOSURE

Technical Problem

A nanodevice that can be formed to have a desired position and a desired shape by using a two-dimensional nanomember and a transistor including the nanodevice is provided. A method of manufacturing the nanodevice is also provided, as well as a method of manufacturing the transistor.

Technical Solution

A nanodevice according to an embodiment of the present invention includes a substrate, a mask layer located on the substrate and having at least one opening, and a nanotube formed on the substrate through the opening along an edge of the opening. The nanotube extends through the opening in a direction substantially perpendicular to a surface of the substrate.

The substrate may include a first substrate portion contact the nanotube, and a second substrate portion surrounded by the first substrate portion. The surface energy of the first substrate portion may be larger than that of the second substrate portion, and a difference in the surface energy between the first substrate portion and the second substrate portion may be about 0.1 J/m$^2$ to about 5 J/m$^2$.

A crystal structure of the substrate may be substantially the same as a crystal structure of the nanotube. The nanotube may include at least one material selected from the group consisting of zinc oxide (ZnO), zinc magnesium oxide (ZnMgO), zinc cadmium oxide (ZnCdO), zinc beryllium oxide (ZnBeO), and zinc magnesium beryllium oxide (ZnMgBeO). The substrate may include silicon, aluminum oxide, gallium arsenide, spinel, silicon, indium phosphide, gallium phosphate, indium aluminum, gallium nitride, indium nitride, aluminum nitride, zinc oxide, magnesium oxide, silicone carbide, titanium oxide, quartz, pyrex, a polymer, and a metal. A cross-section of the nanotube in a direction substantially parallel to a surface of the substrate may be a circle or a polygon, and the substrate may be outwardly exposed through the space.

A nanodevice according to an embodiment of the present invention may further include a seed layer located between the substrate and the mask layer. The nanotube may contact the seed layer. The seed layer may include a first seed layer portion contacting the nanotube and a second seed layer portion enclosed by the first substrate portion. The seed layer may include at least one material selected from the group consisting of silicon, aluminum oxide, gallium arsenide, spinel, silicon, indium phosphide, gallium phosphate, aluminum phosphate, gallium nitride, indium nitride, aluminum nitride, zinc oxide, magnesium oxide, silicone carbide, and titanium oxide, and the nanotube includes at least one material selected from the group consisting of gallium nitride and zinc oxide.

The at least one opening may include a plurality of openings, and a distance between the openings may be about 10 nm to about 100 μm. The openings may have different diameters from one another. The nanodevice may be used as a light emitting device or a bio sensor.

A nanodevice according to an embodiment of the present invention includes a substrate and a mask layer located on the substrate, and the mask layer has at least one opening and a nanowall formed on the substrate through the opening. The nanowall may extend through the opening in a direction substantially perpendicular to a surface of the substrate.

The substrate may include a first substrate portion contacting the nanowall and a second substrate portion surrounded by the first substrate portion. Surface energy of the first substrate portion may be larger than that of the second substrate portion, and a difference in the surface energy between the first and second substrate portions may be about 0.1 J/m$^2$ to about 5 J/m$^2$.

The at least one opening may include a plurality of openings. The plurality of openings may include a first opening and a second opening, and the first opening and the second opening are crossed. A nanodevice according to an embodiment of the present invention may further include a seed layer located between the substrate and the mask layer, and the nanowall may contact the seed layer. The seed layer may include a first seed layer portion contacting the nanowall and a second seed layer portion enclosed by the first substrate portion.

A transistor according to an embodiment of the present invention includes a source electrode, a mask layer located on the source electrode and having at least one opening, a plurality of nanotubes formed on the source electrode through the opening along an edge of the opening and extending through the opening in a direction substantially perpendicular to a surface of the source electrode, an insulating layer formed between the plurality of nanotubes, a dielectric layer covering an upper portion of the insulating layer and a surface of the nanotubes, a gate electrode formed inside the nanotubes to cover the dielectric layer, and a drain electrode located on the gate electrode.

The source electrode may include a first source electrode portion contacting the plurality of nanotubes and a second source electrode portion enclosed by the first source electrode portion. Surface energy of the first source electrode portion may be larger than that of the second source electrode portion, and a difference in the surface energy between the first and second source electrode portions may be about 0.1 J/m$^2$ to about 5 J/m$^2$.

A method of manufacturing a nanodevice according to an embodiment of the present invention includes providing a substrate, forming a mask layer on the substrate, the mask layer having at least one opening, and allowing a nanotube to grow on the substrate along an edge of the opening through the opening. The nanotube may grow in a direction substantially perpendicular to a surface of the substrate.

In allowing the nanotube to grow, the substrate may include a first substrate portion from which the nanotube contacting the first substrate portion grows and a second substrate portion enclosed by the first substrate portion. Surface energy of the first substrate portion may be larger than that of the second substrate portion, and a difference in the surface energy between the first substrate portion and the second substrate portion may be about 0.1 J/m$^2$ to about 5 J/m$^2$.

A method of manufacturing a nanodevice in accordance with an embodiment of the present invention may further include forming a seed layer between the substrate and the mask layer, and the nanotube may grow directly on the seed layer. In allowing the nanotube to grow, the seed layer may include a first substrate portion from which the nanotube contacting the first substrate portion grows, and a second substrate portion enclosed by the first substrate portion.

A method of manufacturing a nanodevice in accordance with an embodiment of the present invention includes forming a mask layer having at least one linear opening on the substrate, and allowing a nanowall to grow on the substrate through the opening. The nanowall may grow in a direction substantially perpendicular to a surface of the substrate.

In allowing the nanotube to grow, the substrate may include a first substrate portion from which the nanotube contacting the first substrate portion grows and a second substrate portion enclosed by the first substrate portion. Surface energy of the first substrate portion may be larger than that of the second substrate portion, and a difference in the surface energy between the first and second substrate portions may be about 0.1 J/m$^2$ to about 5 J/m$^2$.

A method of manufacturing a nanodevice in accordance with an embodiment of the present invention further includes forming a seed layer between the substrate and the mask layer, and the nanowall may grow directly on the seed layer. The seed layer may include a first seed layer portion from which the nanotube contacting the first seed layer portion grows, and a second seed layer portion enclosed by the first seed layer portion.

A method of manufacturing a transistor according to an embodiment of the present invention includes providing a source electrode, forming a mask layer on the source electrode, the mask layer having at least one opening, allowing a plurality of nanotubes to grow through the opening along an edge of the opening, forming an insulating film between the plurality of nanotubes, forming a dielectric layer to cover an upper portion of the insulating layer and a surface of the nanotubes, forming a gate electrode by covering the inside of the nanotubes with the dielectric layer, and forming a drain electrode on the gate electrode. The nanotubes may grow in a direction substantially perpendicular to a surface of the substrate.

The substrate may include a first substrate portion from which the nanotube contacting the first substrate portion grows, and a second substrate portion enclosed by the first substrate portion. Surface energy of the first substrate portion may be larger than that of the second substrate portion, and a difference in the surface energy between the first and second substrate portions may be about 0.1 J/m$^2$ to about 5 J/m$^2$.

A method of manufacturing a transistor according to an embodiment of the present invention further includes forming a seed layer between the substrate and the mask layer, and the nanotubes may grow directly on the seed layer. In allowing the nanotube to grow, the seed layer may include a first seed layer portion from which the nanotube contacting the first seed layer portion grows and a second seed layer portion enclosed by the first seed layer portion.

BEST MODE

Figure 1:
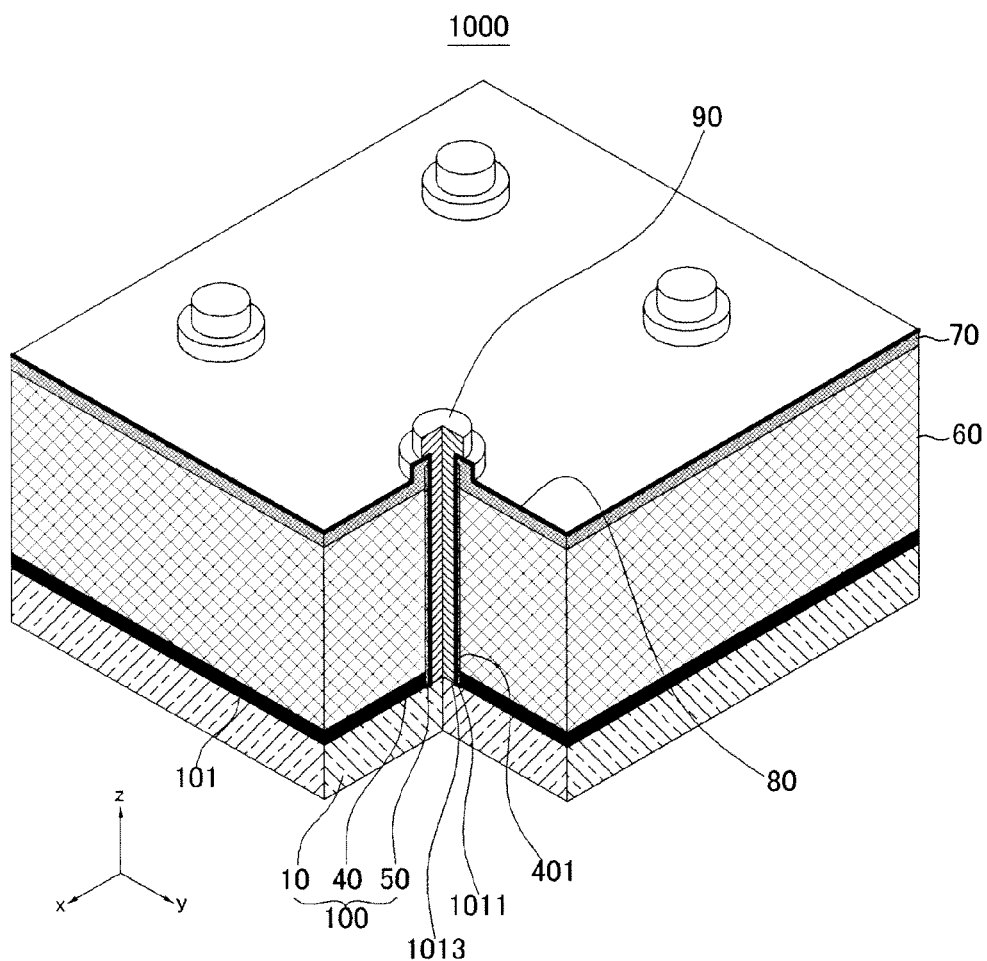
FIG. 1 is a partially cut perspective view schematically illustrating a transistor including a nanodevice in accordance with a first embodiment of the present invention.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper", "over", and the like may be used herein for ease of description to describe one element or feature's relationship to another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented rotated 90 degrees or at other orientations and the spatially relative descriptors used herein are interpreted accordingly.

All terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to perspective views that are schematic illustrations of idealized embodiments of the present invention. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. As an example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

"nano" in a specification indicates a nanoscale. In addition, "nanotube" in the specification indicates a nanoscale structure having an empty center, and "nanowall" indicates a nanoscale structure having a wall shape.

Embodiments of the present invention are explained below with reference to FIGS. 1 to 19. The embodiments are merely to illustrate the present invention and the present invention is not limited thereto.

FIG. 1 schematically illustrates a transistor 1000 including a nanodevice in accordance with a first embodiment of the present invention. In addition, FIG. 1 is a partially cut perspective view illustrating the transistor 1000. The nanodevice 100 shown in FIG. 1 is so small so as to be nano-scaled. Therefore, the nanodevice 100 is enlarged to be shown in FIG. 1. Although the number of the nanodevices 100 in FIG. 1 is four, the embodiments illustrated in FIG. 1 are merely to illustrate the present invention and the present invention is not limited thereto. Thus, the transistor 1000 may include a plurality of nanodevices.

As illustrated in FIG. 1, the transistor 1000 includes a nanodevice 100, an insulator 60, a drain electrode 70, a dielectric layer 80, and a gate electrode 90. Here, the nanodevice 100 includes a substrate 10, a mask layer 40, and a nanotube 50. The substrate 10 serves as a source electrode.

The substrate 10 may include gallium nitride, zinc oxide, single crystal sapphire, gallium arsenide, spinel, silicon, silicone carbide, indium phosphide, quartz, or pyrex. In a case in which the substrate 10 is formed using single crystalline silicon, quartz, or pyrex, a dimension of the substrate 10 may be enlarged. Thus, the cost required to form the nanodevice 100 may be saved. Particularly, in case that a single crystalline silicon substrate is used, electrical conductivity of the substrate 10 may be effectively controlled. Thus, various kinds of devices may be manufactured. In addition, the substrate 10 is patterned to form one source electrode at one transistor 1000.

As a result, a voltage applied to each source electrode of the transistor 1000 may be controlled because the source electrodes are electrically insulated from one another.

The mask layer 40 is located on the substrate 10. An opening 401 is formed through the mask layer 40 by using an etching process. The nanotube 50 is formed along an edge of the opening 401, and extends in a direction substantially perpendicularly to a surface 101 of the substrate 10. That is, the nanotube 50 extends in the x-axis direction. The diameter and shape of the nanotube 50 may be controlled.

The surface 101 of the substrate 10 may include a first substrate portion 1011 and a second substrate portion 1013, and the first substrate portion 1011 may contact the nanotube 50. The second substrate portion 1013 may not contact the nanotube 50. The second substrate portion 1013 is surrounded by the first substrate portion 1011. Here, surface energy of the first substrate portion 1011 is relatively larger than that of the second substrate portion 1013. Thus, the nanotube 50 is formed directly on the first substrate portion 1011, and may not be formed on the second substrate portion 1013. A difference in the surface energy between the first substrate portion 1011 and the second substrate portion 1013 is due to a radius of curvature of a surface thereof. The first substrate portion 1011 may have a very small radius of curvature because the first substrate portion 1011 contacts the mask layer 40, and on the other hand, the second substrate portion 1013 is a surface of the substrate so that a radius of curvature of the second substrate portion 1013 is infinite. Thus, the surface energy of the second substrate portion 1013 is smaller than that of the first substrate portion. Because of the difference in the energy, the nanowall or the nanotube may grow along the first substrate portion 1011 corresponding to a boundary between the substrate 10 and the opening 401.

Here, the difference in the surface energy between the first substrate portion 1011 and the second substrate portion 1013 may be about $0.1$ $J/m^2$ to about $5$ $J/m^2$. If the difference in the surface energy between the first and second substrate portions 1011 and 1013 is too low or high, the nanotube or the nanowall may not grow.

The nanotube 50 may be formed using zinc oxide (ZnO), zinc magnesium oxide (ZnMgO), zinc cadmium oxide (ZnCdO), zinc beryllium oxide (ZnBeO), or zinc magnesium beryllium oxide (ZnMgBeO).

If the substrate 10 is formed using gallium nitride, the nanotube 50 may be formed using zinc oxide. As one alternative, the substrate 10 and the nanotube 50 may be formed using zinc oxide, and as another alternative, the substrate 10 and the nanotube 50 may be formed using gallium nitride. If the nanotube 50 epitaxially grows on the substrate 10, a seed layer may not be formed on the substrate 10. The nanotube 50 may be deposited on the substrate 10 by using a metal organic chemical vapor deposition (MOCVD) process.

An insulator 60 is formed between the plurality of the nanotubes 50. Thus, the nanodevices 100 are electrically insulated from one another. In addition, the insulator 60 may be located between the substrate 10 serving as a source electrode and a drain electrode 70 so that the substrate 10 may be insulated from the drain electrode 70. Thus, operations of the nanodevice 100 may be respectively controlled. The drain electrode 70 is located on the nanotube 50 and the insulator 60, the dielectric layer 80 is formed on inner side faces of the drain electrode 70 and the nanotube 50, and the dielectric layer 80 may electrically insulate the substrate 10 from the gate electrode 90. In addition, the dielectric layer 80 may electrically insulate the drain electrode 70 from the gate electrode 90.

In a case in which the transistor 1000 in FIG. 1 is connected to a power source, an electrode may flow from the substrate 10 serving as a source electrode into the drain electrode 70. In a case in which an electric field is generated at the nanotube 50 by applying a voltage to the gate electrode 90, a resistance of a channel may be varied. Thus, a flow of a plurality of carriers may be controlled.

The nanotube 50 in FIG. 1 extends in an x-axis direction to have a relatively large gate area. Thus, the transistor 1000 having a relatively large switching function may be manufactured. Hereinafter, a method of manufacturing the transistor 1000 will be illustrated with reference to FIGS. 2 to 13.

Figure 2:
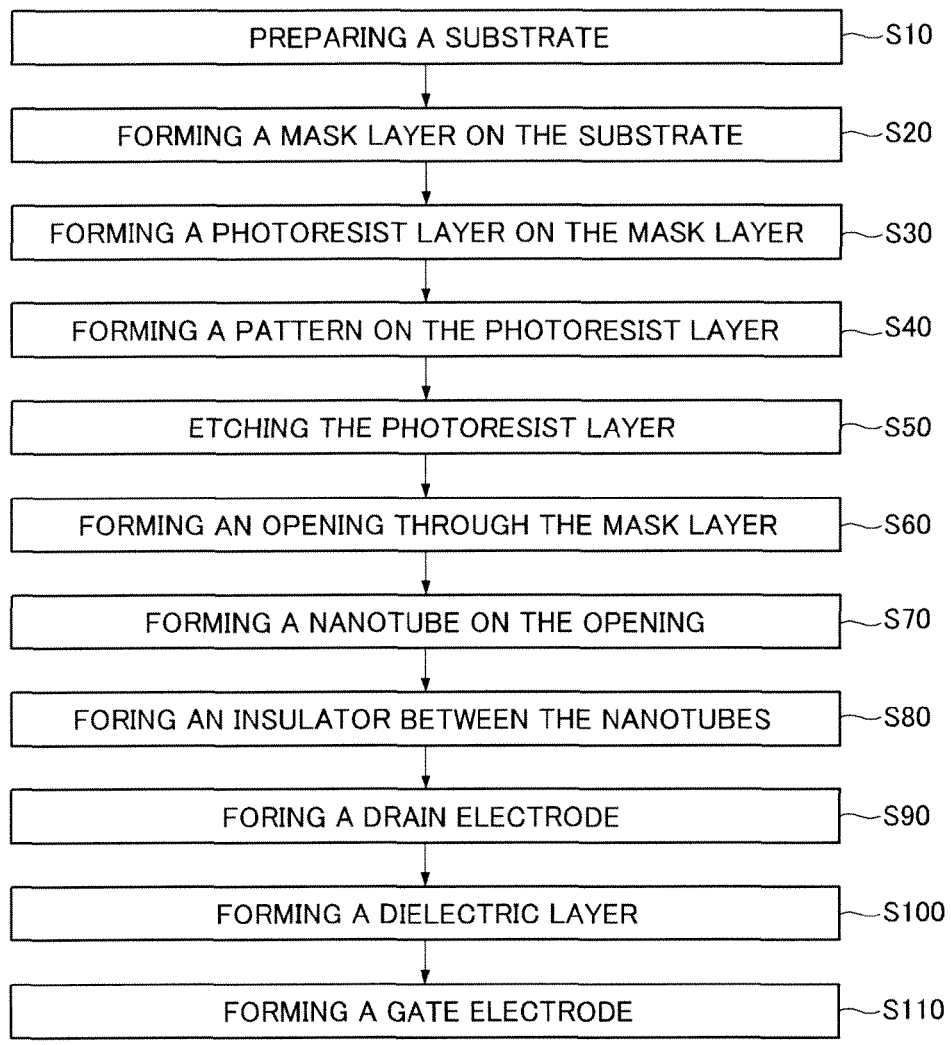
FIG. 2 illustrates a flow chart of a method for manufacturing the transistor in FIG. 1.

FIG. 2 illustrates a flow chart of a method for manufacturing the transistor in FIG. 1, while FIGS. 3 to 13 schematically illustrate processes of each step of methods for manufacturing the transistor in FIG. 1. Hereinafter, each step in FIG. 2 is illustrated with reference to FIGS. 3 to 13.

Figure 3:
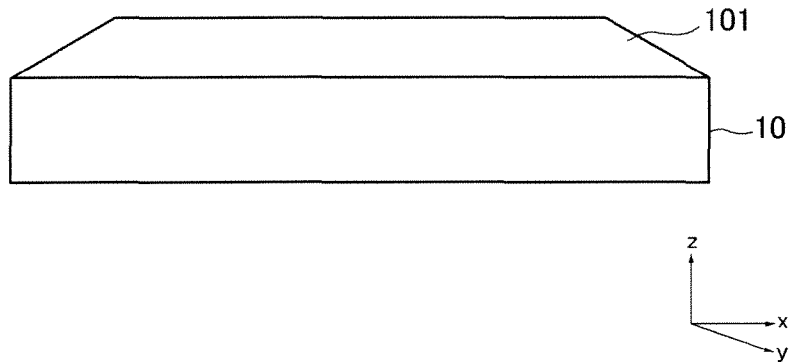
FIGS. 3 to 13 schematically illustrate processes of each step of methods for manufacturing the transistor in FIG. 1.

As illustrated in FIG. 2, a substrate 10 is provided in Step 10. A seed layer may be formed on the substrate 10. As illustrated in FIG. 3, a surface 101 of the substrate 10 may be substantially perpendicular to an x-axis direction.

Figure 4:
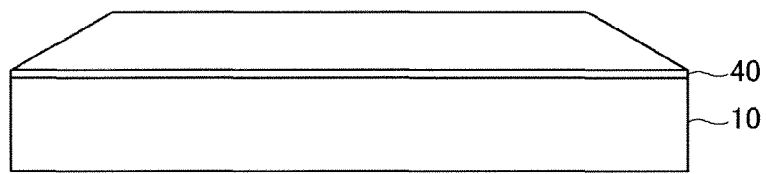

Thereafter, a mask layer 40 is formed on the substrate 10 in Step 20 of FIG. 2. The mask layer 40 may include amorphous silicon oxide or silicon nitride. As illustrated in FIG. 4, the mask layer 40 may be formed on the surface 101 of the substrate by using a plasma enhanced chemical vapor deposition (PECVD) process. A thickness of the mask layer 40 may be about 10 nm to about 300 nm.

Figure 5:
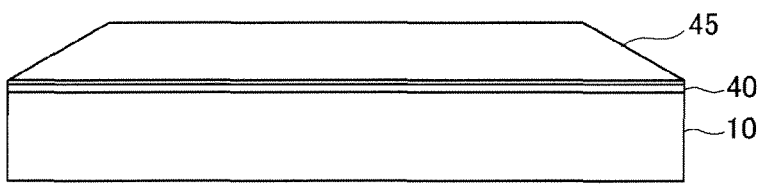

A photoresist layer 45 is formed on the mask layer 40 in Step 30 of FIG. 2. The photoresist layer 45 may be formed using polymethyl methacrylate (PMMA). As illustrated in FIG. 5, the mask layer 40 is coated with a photoresist material by using a spin-coating process. The photoresist material is then baked to form the photoresist layer 45.

Figure 6:
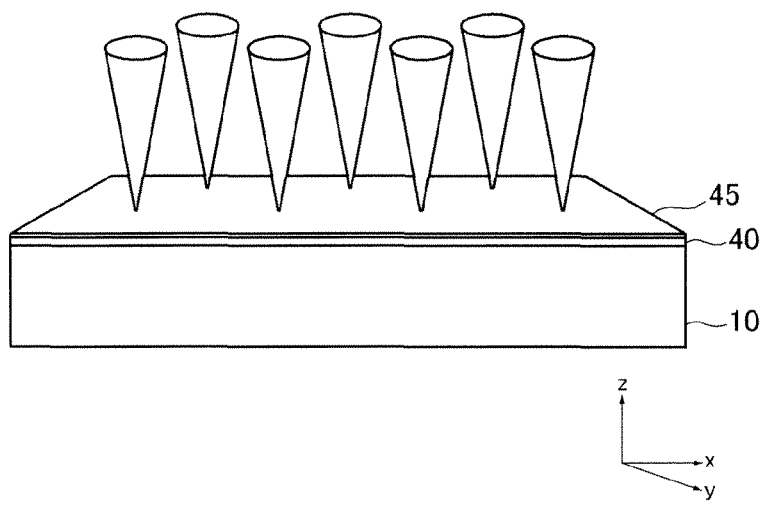

A pattern is formed by providing the photoresist layer 45 with light or an electron beam in Step 40 of FIG. 2. As illustrated in FIG. 6, the light or the electron beam is provided to the photoresist layer 45 so that a pattern having a desired shape may be formed.

Figure 7:
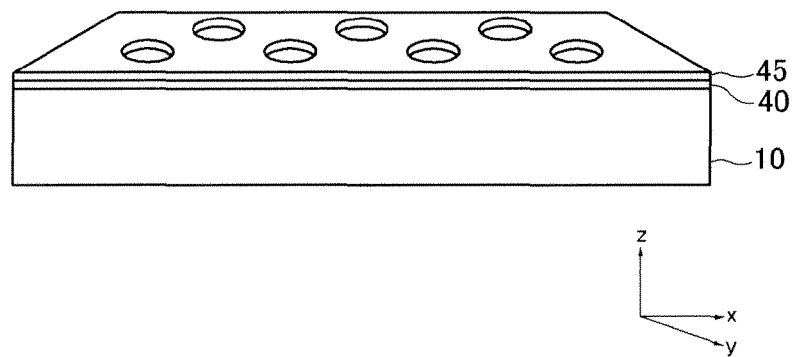

The photoresist layer 45 is etched by using a developer so that a portion of the photoresist layer 45 exposed by the light or the electron beam by be selectively removed in Step 50 of FIG. 2. Thus, as illustrated in FIG. 7, the mask layer 40 may be exposed through the pattern.

Figure 8:
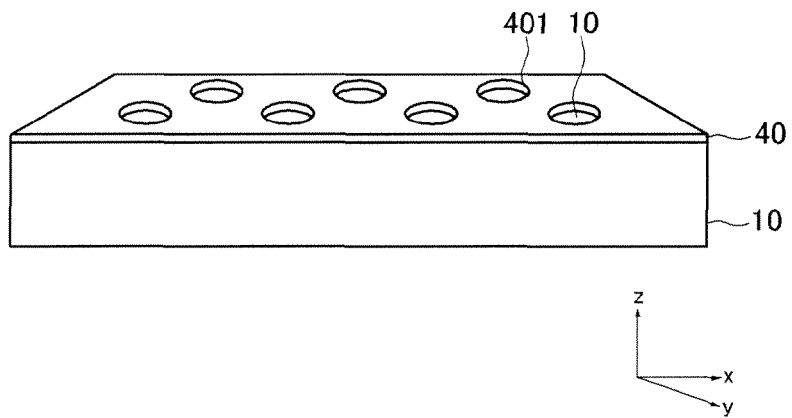

The mask layer 40 is then etched to form an opening 401 in Step 60 of FIG. 2, and it may be physically etched using plasma. Alternatively, the mask layer 40 may be chemically etched using a chemical solution. The photoresist layer 45 is then removed by an organic solution. Thus, as illustrated in FIG. 8, the substrate 10 may be exposed through an opening 401 of the mask 40.

A nanotube 50 is formed in the opening 401 by providing a reaction precursor in a reactor in Step 70 of FIG. 2. The nanotube 50 is formed only on the opening 401 by the mask layer 40 in performing a metal organic chemical vapor deposition.

Figure 9:
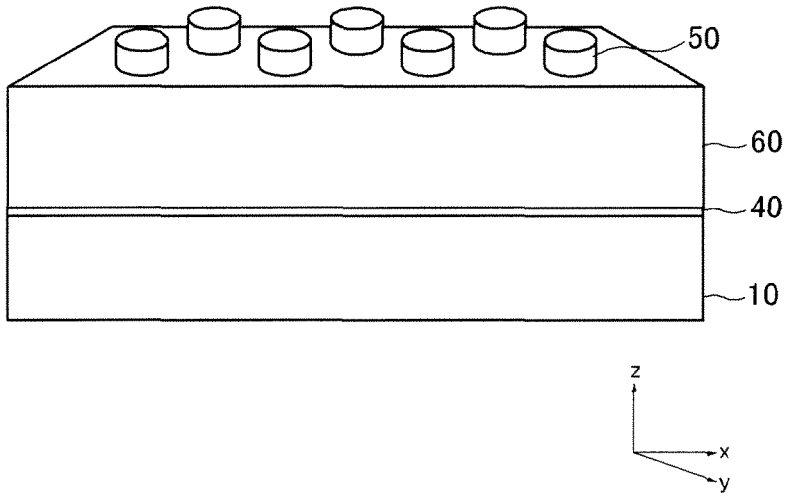

Diethyl zinc (DEZn) and oxygen (O2) may be used as the reaction precursor. When the reaction precursor is provided, DEZn is conveyed by a carrier gas at one side and oxygen is injected from the other side. Thus, as illustrated in FIG. 9, the nanotube including GaN formed by a reaction between Ga of TMGa and nitrogen (N) of ammonia (NH3) may be formed along an edge of the opening 401.

Figure 10:
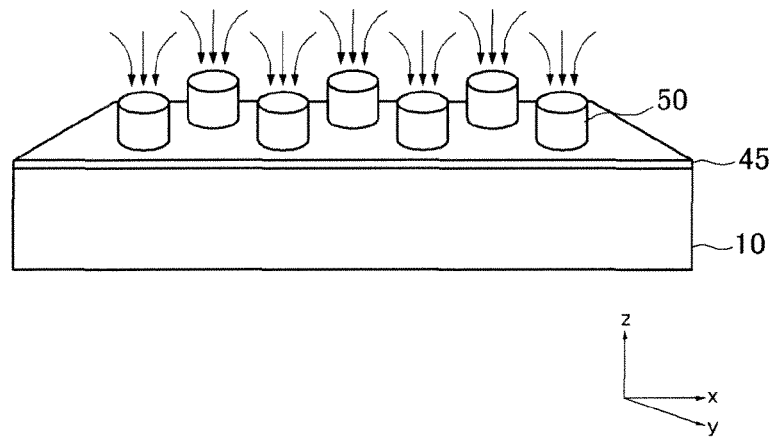

The insulator 60 is formed between the plurality of nanotubes 50 in Step 80 of FIG. 2. That is, as illustrated in FIG. 10, the nanotubes 50 may be electrically insulated from one another by the insulator 60. In addition, the insulator 60 may insulate the substrate 10 serving as the source electrode from the drain electrode 70. The insulator 60 may be formed using a non-conductive material.

Figure 11:
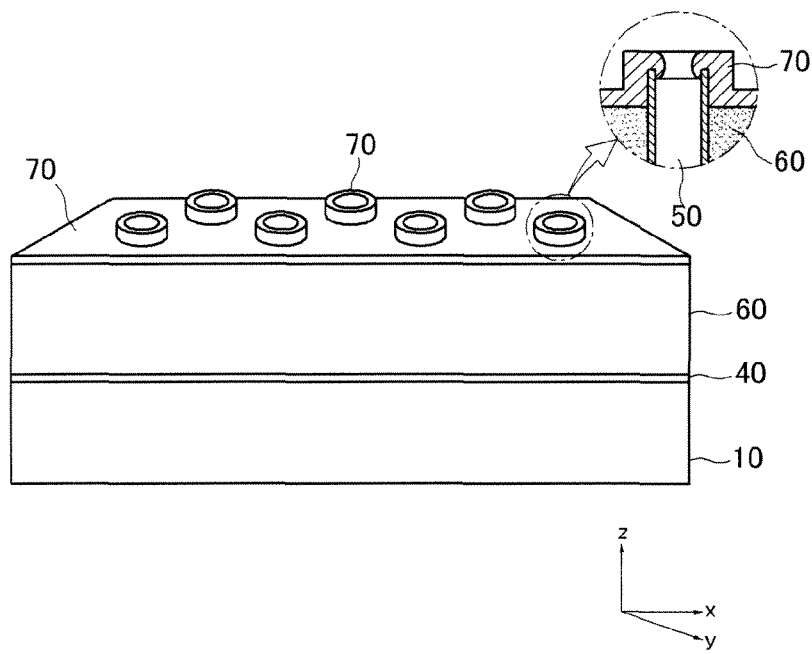

The drain electrode 70 is formed on the insulator 60 and the nanotubes 50 in Step 90 of FIG. 2. As illustrated in FIG. 11, the drain electrode 70 is formed by a tilt rotation deposition process. An enlarged circle in FIG. 11 illustrates a cross-section taken along a dotted line having a circle shape in an x-axis direction, and as illustrate in the enlarged circle in FIG. 11, the drain electrode 50 may be formed only over the nanotube 50.

Figure 12:
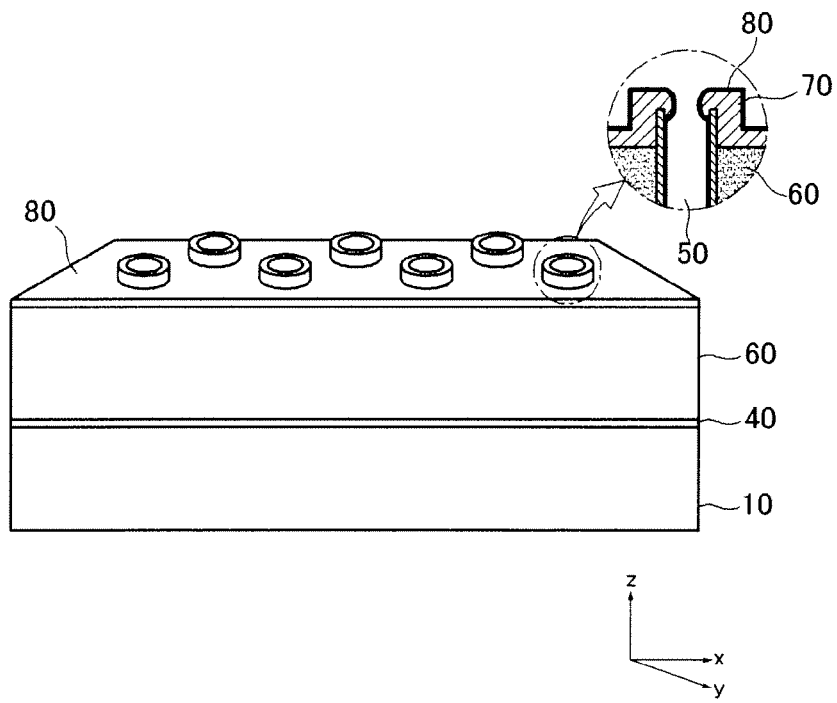

The dielectric layer 80 is formed on the drain electrode 70 and inside the nanotube 50 in Step 100 of FIG. 2. An enlarged circle in FIG. 12 illustrates a cross-sectional view taken along a dotted line having a circle shape in the x-axis direction. As illustrated in the enlarged circle in FIG. 12, the dielectric layer 80 is formed on the drain electrode 70 and on an inner face of the nanotube 50. The dielectric layer 80 is formed on the entire inner face of the nanotube 50, and in addition, the dielectric layer 80 may insulate the drain electrode 70 from the gate electrode 90.

Figure 13:
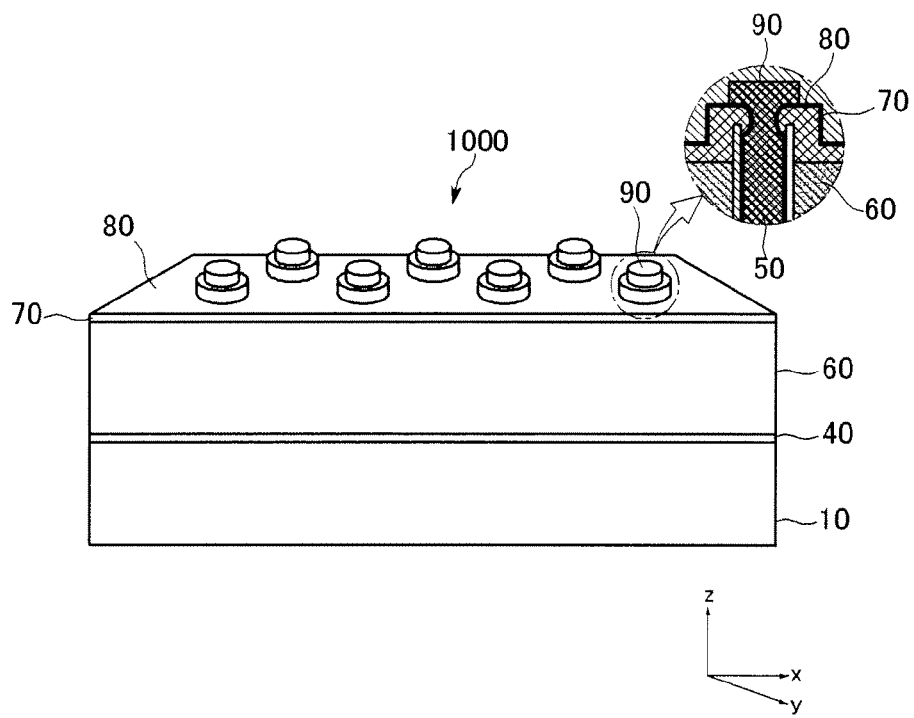

The gate electrode 90 is formed inside the nanotube 50 in Step 110 in FIG. 2. As illustrates in FIG. 13, the transistor 1000 may be manufactured by forming the gate electrode 90. An enlarged circle in FIG. 13 is a cross-sectional view taken along a dotted line having a circle shape in an x-axis direction, and as illustrated in the enlarged circle in FIG. 13, the transistor may be formed using the gate electrode 90 and the drain electrode 70. If a power source is connected to the substrate 10, a plurality of carriers is provided through the substrate 10, and the carriers flow toward the drain electrode 70. A current of the carriers between the source electrode and the drain electrode 70 may be controlled by a voltage applied to the gate electrode 90.

Figure 14:
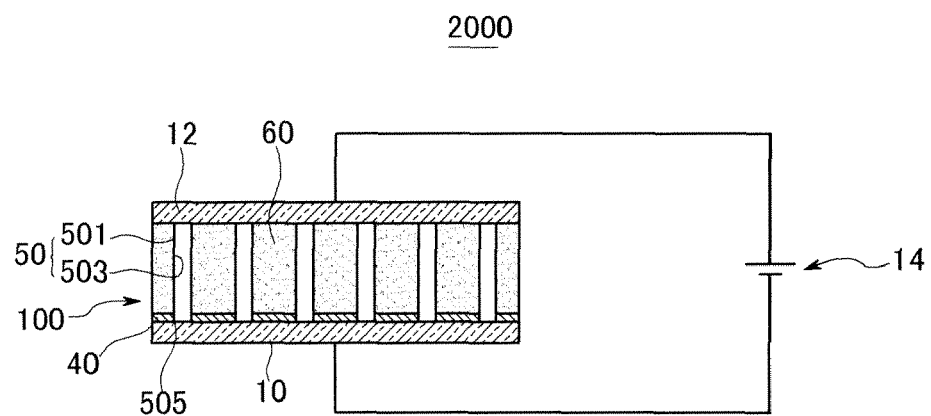
FIG. 14 schematically illustrates a light emitting device including a nanodevice in accordance with the first embodiment of the present invention.

FIG. 14 schematically illustrates a light emitting device 2000 including a nanodevice 100 in accordance with the first embodiment of the present invention. A structure of the light emitting device 2000 in FIG. 14 is substantially the same as that of the transistor 1000 in FIG. 1, so the same reference numerals will be used to refer to the same or like parts as those described in the first embodiment, and further explanation will be omitted.

As illustrated in FIG. 14, an insulator 60 is formed between the plurality of the nanotubes 50. The electrode 50 is formed on the plurality of nanotubes 50 so that the electrode 12 may contact the plurality of nanotubes 50. Thus, if a power source 14 connected to the electrode 12 and the substrate 10 provides a voltage, a light may be emitted from the nanotube 50. Electrons are transferred through the nanotube 50 extending in the x-axis direction so that transfer efficiency may be superior.

The nanotube 50 includes an outer face 501 and an inner face 503 so that an area of the nanotube 50 may be large. Thus, when a light emitting layer of a different kind of structure or a quantum well structure is formed at a surface of the nanotube 50, light emitting efficiency may be very large due to an enlarged area of the light emitting layer. In addition, a lower end portion 505 of the nanotube 50 only contacts the substrate 10 so that the contact area may be very small. Thus, although the same voltage is applied to the light emitting device 2000, the current density may increase. As a result, a light emission may be maximized with a relatively small amount of power.

In addition, power consumption of the light emitting device 2000 is relatively small so that energy efficiency of the light emitting device 2000 may be relatively high. A light emitting diode may be formed by using the above-described processes.

Figure 15:
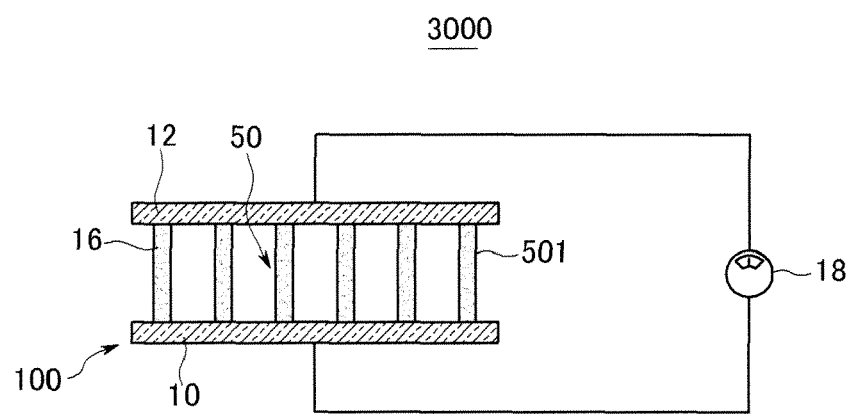
FIG. 15 schematically illustrates a bio sensor including the nanodevice in accordance with the first embodiment of the present invention.

FIG. 15 schematically illustrates a bio sensor 3000 including the nanodevice 100 in accordance with the first embodiment of the present invention.

As illustrated in FIG. 15, a reactive material 16 that is reacted with a predetermined enzyme may be formed at an outer face 501 of the nanotube 50. The reactive material 16 may be reacted with the enzyme to cause a voltage change of the nanotube 50. The electrode 12 and the substrate 10 formed on the nanotube 50 are connected to a display portion 18 so that a voltage variation of the nanotube 50 is displayed in the display portion 18. The bio sensor 3000 that is selectively reacted with a predetermined enzyme may be manufactured in the above-described manner. The nanotube 50 has a wide surface area so that detection efficiency may be superior, and as a result, the nanotube 50 may be suitable for the bio sensor 3000.

Figure 16:
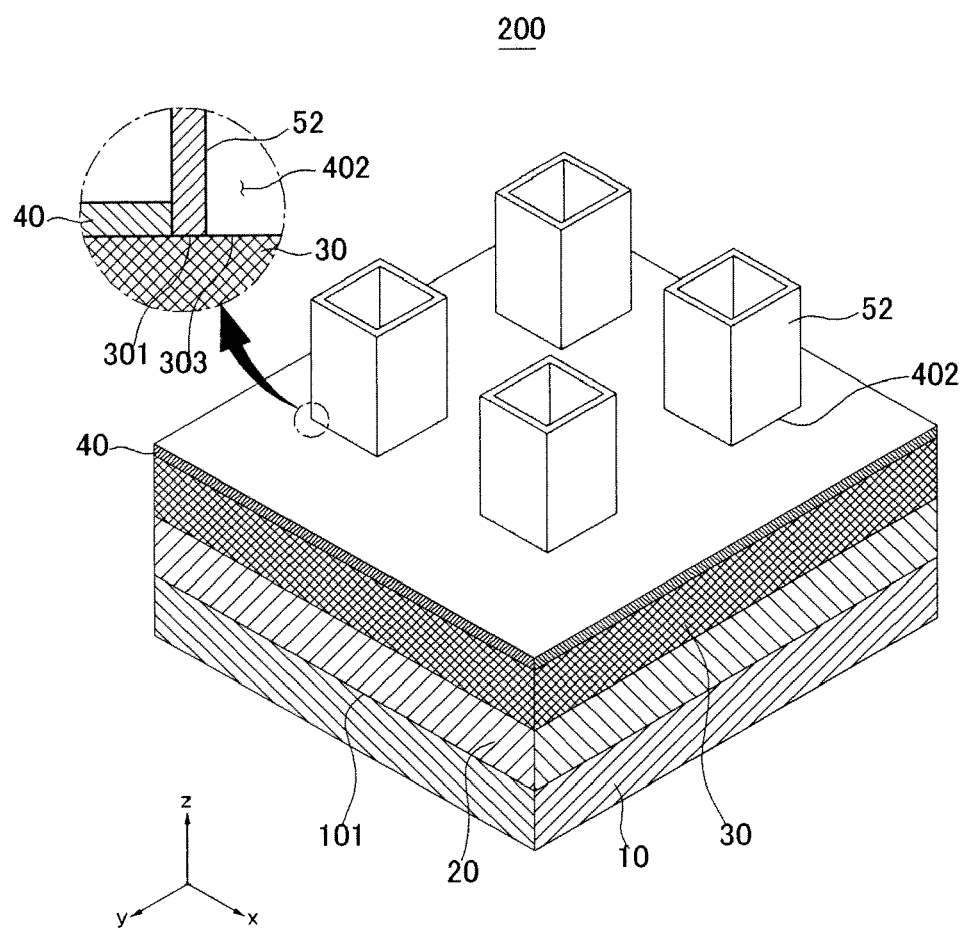
FIG. 16 schematically illustrates a nanodevice in accordance with a second embodiment of the present invention.

FIG. 16 schematically illustrates a nanodevice 200 in accordance with a second embodiment of the present invention. An enlarged circle in FIG. 16 is a cross-sectional view of an inside of the nanodevice 200. A structure of the nanodevice 200 in FIG. 16 is substantially the same as a structure of nanodevice 100 included in a transistor 1000 in FIG. 1, so the same reference numerals will be used to refer to the same or like parts as those described in the first embodiment, and further explanation will be omitted.

As illustrated in FIG. 16, the nanodevice 200 includes a substrate 10, a buffer layer 20, a seed layer 30, a mask layer 40, and a nanotube 52. A single crystalline silicon substrate having a (111) crystal face may be used as the substrate 111.

The substrate 10 may be formed using various materials to control the crystalline property of the seed layer 30 or to not use the buffer layer 20 or the seed layer 30. The substrate 10 may have a surface 101 substantially parallel to an xy-plane direction.

The buffer layer 20 is formed on the substrate 10. The buffer layer 20 may reduce stress due to a difference in a lattice constant between the substrate 10 and the seed layer formed directly on the buffer layer 20. For example, the buffer layer 20 may be formed using an aluminum nitride.

A seed layer 30 may be formed on the buffer layer 20. The seed layer 30 may be formed using chemical vapor deposition (CVD), metal organic chemical vapor deposition (MOCVD), sputtering, an electron beam, electron beam evaporization, thermal evaporization, pulsed laser deposition, molecular beam epitaxy, chemical beam evaporization, a hydrothermal synthesis, etc. For example, the seed layer 30 may be an epitaxial thin film formed using gallium nitride.

A mask layer 40 and a photoresist layer (not shown) are formed on the seed layer 30 by using substantially the same processes as those illustrated in FIG. 2, and then etched. Thus, an opening 402 having a rectangular shape may be formed at the mask layer 40. The photoresist layer (not shown) is removed after the opening 402 is formed. The mask layer 40 may be formed by depositing silicon oxide, and the thickness of the mask layer 40 may be about a few nanometers to dozens of micrometers. The mask layer 40 may be formed using a material that is capable of allowing the nanotube 52 to grow.

Thereafter, a reaction precursor is injected to a reactor so that the nanotube 52 extending an x-axis direction may be formed through the opening 402. Diethyl zinc (DEZn) and oxygen (O2) may be injected into the reactor as the reaction precursor. The DEZn serves as a zinc source so that the nanotube 52 including zinc oxide formed by a reaction between zinc and oxygen (O2) may be formed on the seed layer 30. The nanotube 52 may be selectively grown on a predetermined portion of the seed layer 30. Anisotropic surface energy may be used to allow the nanotube 52 to grow from the predetermined portion of the seed layer 30. Thus, the nanotube 52 may grow perpendicularly to the surface 101 of the substrate 10.

Gallium nitride and zinc oxide have substantially the same crystal structure. Surface energy of the $\{10\bar{1}0\}$ crystal face and the $\{11\bar{2}0\}$ crystal face of zinc oxide is lower than that of the $\{0001\}$ crystal face of zinc oxide. Thus, non-catalytic growth of wurtzite including zinc oxide is caused because the crystal structure of wurtzite has a relatively large anisotropic property of surface energy. The anisotropic property of surface energy may allow the nanotube 52 including zinc oxide to grow in the [0001] direction. Gallium nitride included in the seed layer 30 and zinc oxide included in the nanotube 52 have substantially the same crystal structure. In addition, a difference in lattice constant between gallium nitride and zinc oxide is relatively small, at about 1.9%. As a result, a nanodevice having a single crystalline property may be formed by high quality epitaxial growth.

The nanodevice having the seed layer including gallium nitride and the nanotube 52 including zinc oxide may be formed. The above embodiments are merely to illustrate the present invention and the present invention is not limited thereto. Thus, the seed layer and the nanotube may be formed using different materials. The above-described nanotube is composed of a nanowall so that the nanotube may be called a nanowall.

The nanotube 52 epitaxially grows from the seed layer 30 so that the nanotube 52 may extend in the x-axis direction. As a result, the nanotube 52 may be rigidly supported by the seed layer 30, and as a result, the nanotube 52 may be stably manufactured. The nanotube 52 is formed on the seed layer 30 along an edge of the opening 402, so the nanotube 52 may have a rectangular shape.

As illustrated in an enlarged circle in FIG. 16, the nanotube 52 may grow on the seed layer 30. An outer side face of the nanotube 52 contacts the mask layer 402. The seed layer 30 exposed through the opening 402 may include a first seed layer portion 301 and a second seed layer portion 303. Here, the first seed layer portion 301 corresponds to a portion located directly below the nanotube 52, and neighbors the mask layer 40. In addition, the second seed layer portion 303 corresponds to a portion surrounded by the first seed layer portion 301.

The first seed layer portion 301 neighbors the mask layer 40 so that a surface energy of the first seed layer portion 301 is larger than that of the second seed layer portion 303, because the opening 402 has at least one side. Thus, the nanotube 52 is formed only on the first seed layer portion 301 having the high surface energy.

Figure 17:
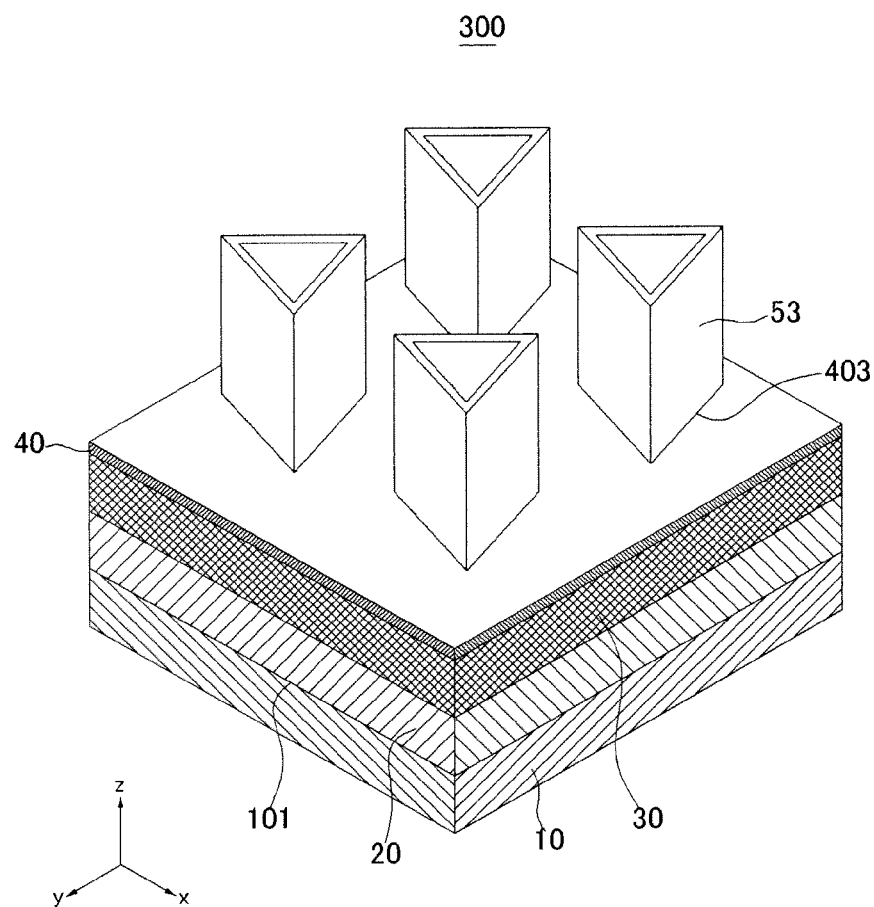
FIG. 17 schematically illustrates a nanodevice in accordance with a third embodiment of the present invention.

FIG. 17 schematically illustrates a nanodevice 300 in accordance with a third embodiment of the present invention. A structure of the nanodevice 300 in FIG. 17 is substantially the same as the structure of the nanodevice 200 in FIG. 16, so the same reference numerals will be used to refer to the same or like parts as those described in the first embodiment, and further explanation will be omitted.

As illustrated in FIG. 17, a nanotube 53 having a triangular column shape is formed. When the opening 403 is formed to have a triangular shape, the nanotube 53 may grow along an edge of the opening 403. Thus, a plurality of nanotubes 53 having the triangular column shape may be formed.

As described above, the opening is formed to have a shape of a circle or a polygon so that the nanotube having the desired shape may be formed. The nanotube having the desired shape may be used in various devices. An interval between the nanotubes may also be adjusted so that the nanotubes may be used in various devices.

On the contrary, shapes and locations of conventional nanotubes may not be controlled so that there is a limit to use the conventional nanotube in various devices. On the other hand, the above-described problems may be solved because shapes and locations of the nanotubes of the present invention may be controlled.

Figure 18:
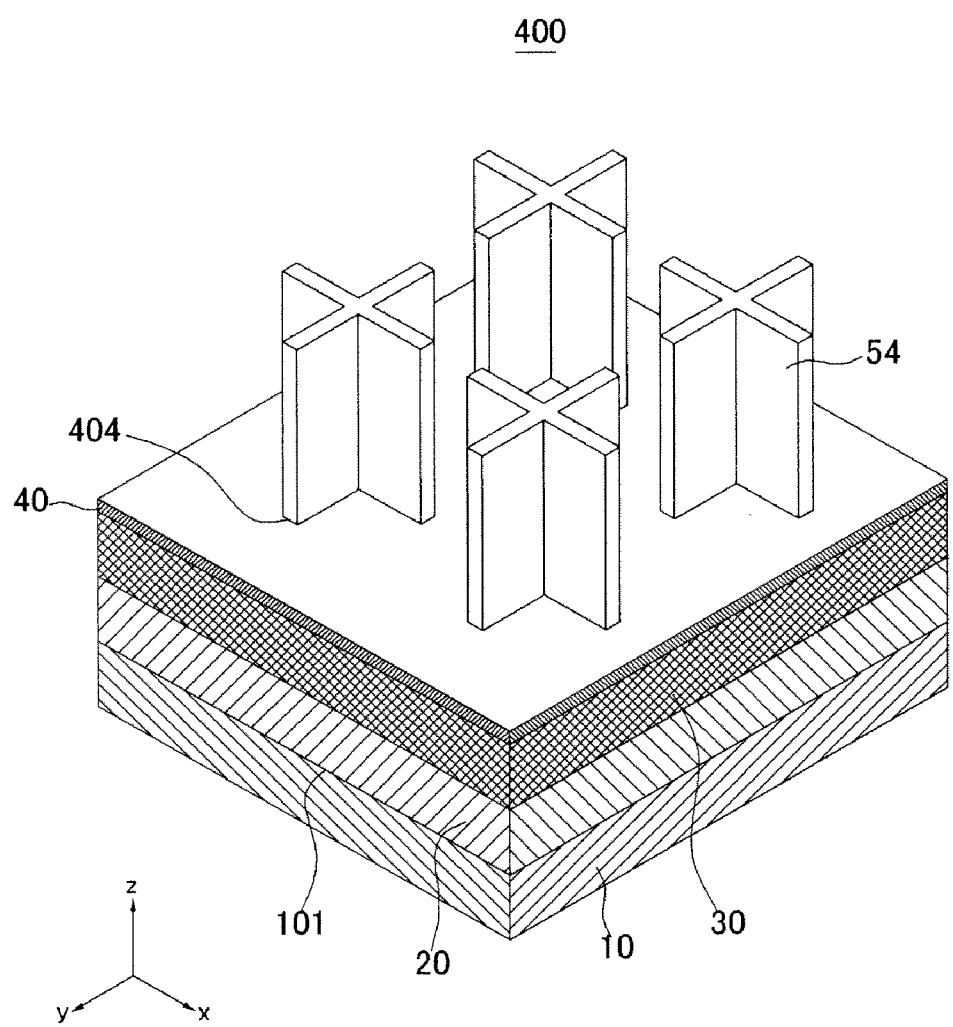
FIG. 18 schematically illustrates a nanodevice in accordance with a fourth embodiment of the present invention.

FIG. 18 schematically illustrates a nanodevice 400 in accordance with a fourth embodiment of the present invention. The nanodevice 400 of FIG. 18 is substantially the same as the nanodevice 200 in FIG. 16, except for a nanowall 54. Thus, the same reference numerals will be used to refer to the same or like parts as those described in the first embodiment, and further explanation will be omitted.

As illustrated in FIG. 18, a linear opening 404 is formed at the mask layer 40 after the mask layer 40 is formed on the seed layer. Thus, when metal organic chemical vapor deposition is used, the nanowall 54 may be formed only through the opening 404. As a result, the nanowall 54 may be effectively formed. Here, the opening 404 has an "X" shape so that a nanowall having an "X" shape may be formed.

Figure 19:
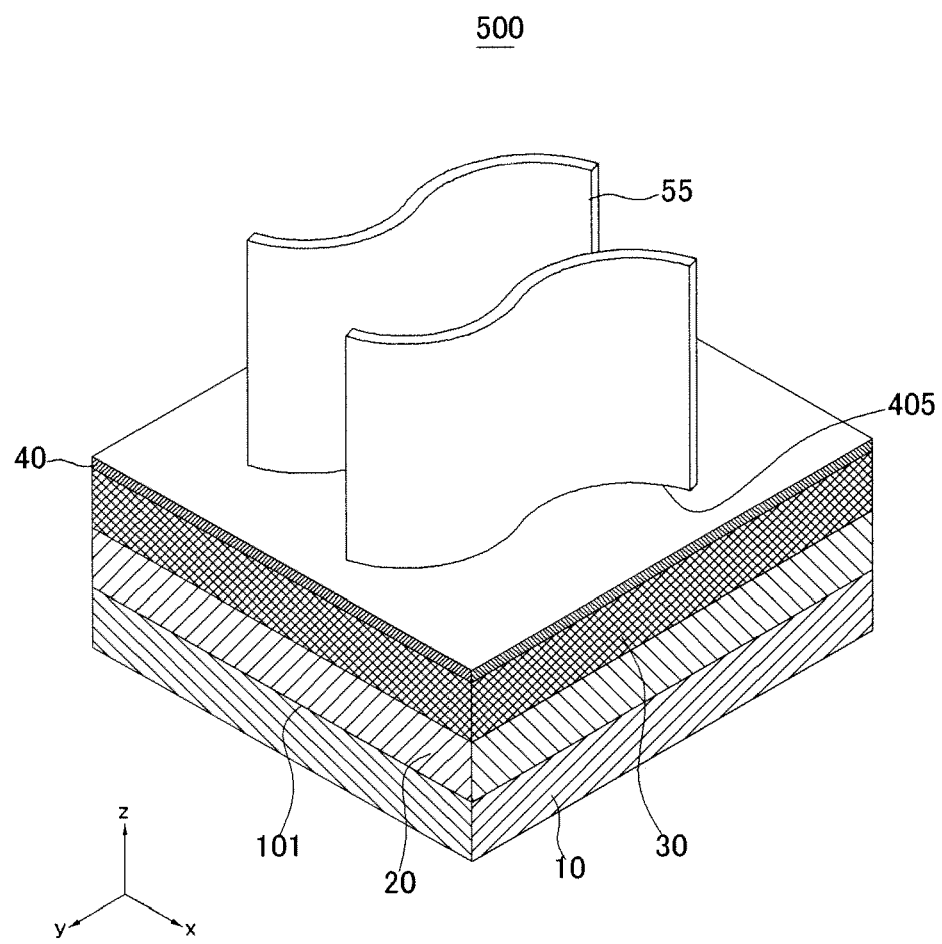
FIG. 19 schematically illustrated a nanodevice in accordance with a fifth embodiment of the present invention.

FIG. 19 schematically illustrated a nanodevice 500 in accordance with a fifth embodiment of the present invention. The nanodevice 500 in FIG. 19 is substantially the same as the nanodevice 400 in FIG. 18, except for the nanowall 55. Thus, the same reference numerals will be used to refer to the same or like parts as those described in the first embodiment, and further explanation will be omitted.

As illustrated in FIG. 19 the opening 405 may be linearly formed to have a wave shape so that a nanowall 55 having a wave shape may be formed. Thus, a shape of the opening 405 may be desirably controlled to form the nanowall 55 having various shapes. In addition, a location of the nanowall 55 may be desirably controlled, so an interval between the nanowalls 55 may be desirably controlled.

On the contrary, shapes and locations of conventional nanowalls may not be controlled so that there is a limit to use the conventional nanowall 55 in various devices. On the other hand, the above-described problems may be solved because shapes and locations of the nanowalls of the present invention may be controlled.

Hereinafter, the present invention may be more fully described with reference to examples. The examples are merely to illustrate the present invention, and the present invention is not limited thereto.

Example 1

A seed layer was formed on a single crystalline silicon substrate by using gallium nitride. In order to form an epitaxial seed layer including gallium nitride by using a metal organic chemical vapor deposition (MOCVD) process, a buffer layer including aluminum nitride was formed to a thickness of about 10 nm to about 50 nm. A seed layer was then formed on the buffer layer.

Amorphous silicon oxide ($SiO_2$) or silicon nitride ($SiN_x$) was deposited on the seed layer to form a mask layer required for patterning the seed layer. In this case, plasma-enhanced chemical vapor deposition was employed. As a result, a mask layer having a thickness of about 20 nm to about 300 nm was formed on the seed layer. A photosensitive resin was coated on the mask layer by using a spin coating process, and was then baked. The photosensitive resin was polymethyl methacrylate (PMMA).

The photosensitive resin was heated after the photosensitive resin was formed on the mask layer. The photosensitive resin was exposed to light or an electron beam to form a desired pattern. Thereafter, the photosensitive resin was developed using a developer so that a portion of the photosensitive resin exposed to the light or the electron beam was removed. As a result, the mask layer was partially exposed. An exposed portion of the mask layer was etched by using a pattern of the photoresist resin as a mask pattern so that the seed layer was partially exposed, and then the photosensitive resin was removed using an organic solution.

Figure 20:
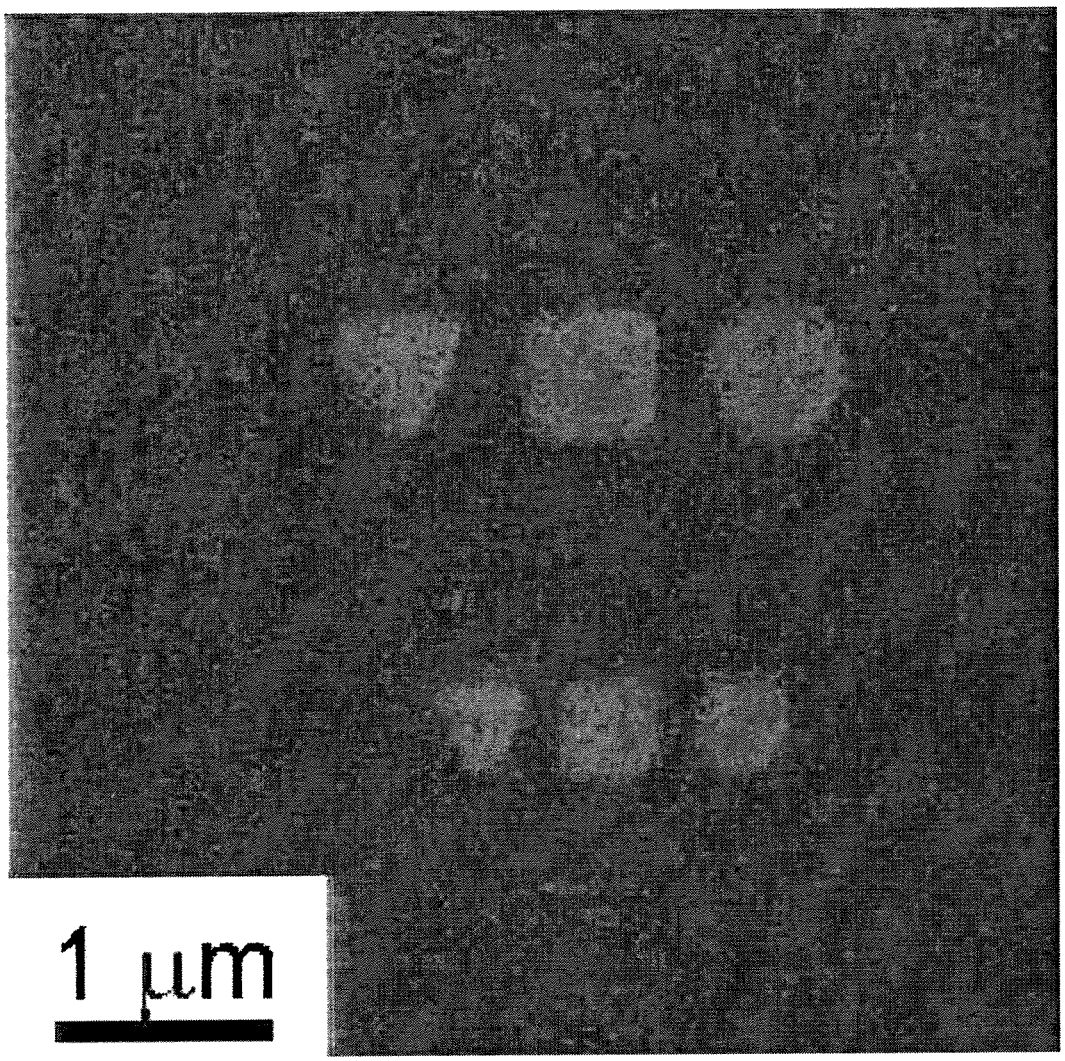
FIG. 20 is a scanning electron microscopy picture showing a desired pattern of the seed layer outwardly exposed through the mask layer.

FIG. 20 is a scanning electron microscopy picture showing a desired pattern of the seed layer outwardly exposed through the mask layer. The black portion indicates the mask layer and the gray portion indicates the seed layers.

As illustrated in FIG. 20, the seed layers having triangular, rectangular, and circular shapes were exposed through an opening of the mask layer indicated as the black portion. The seed layers having triangular, rectangular, and circular shapes having different sizes were thereby formed. Thereafter, nanotubes including zinc oxide were formed on the seed layer by using a metal organic chemical vapor deposition (MOCVD) process.

Figure 21:
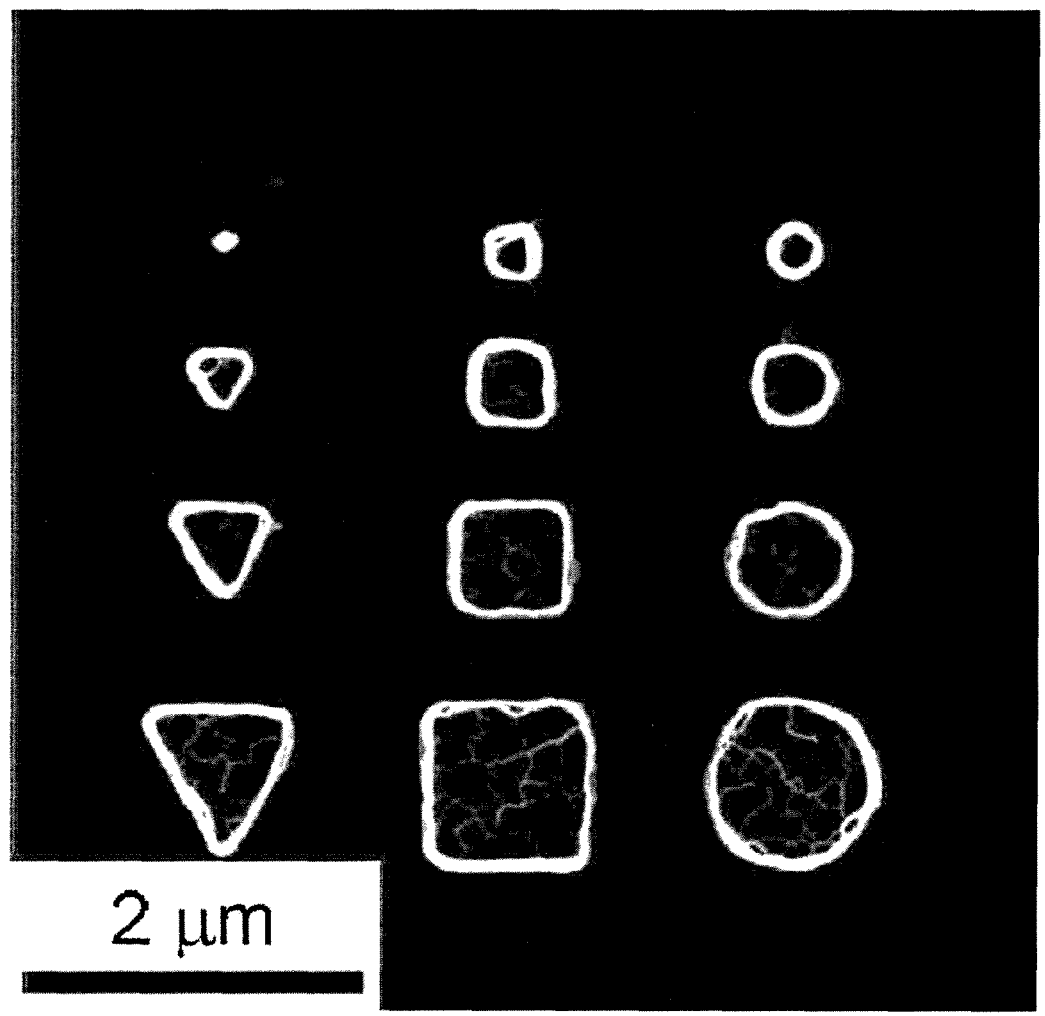
FIG. 21 and FIG. 22 are a plan scanning electron microscopy picture and a solid scanning electron microscopy picture of the nanotube formed on the seed layer in FIG. 20, respectively.
Figure 22:
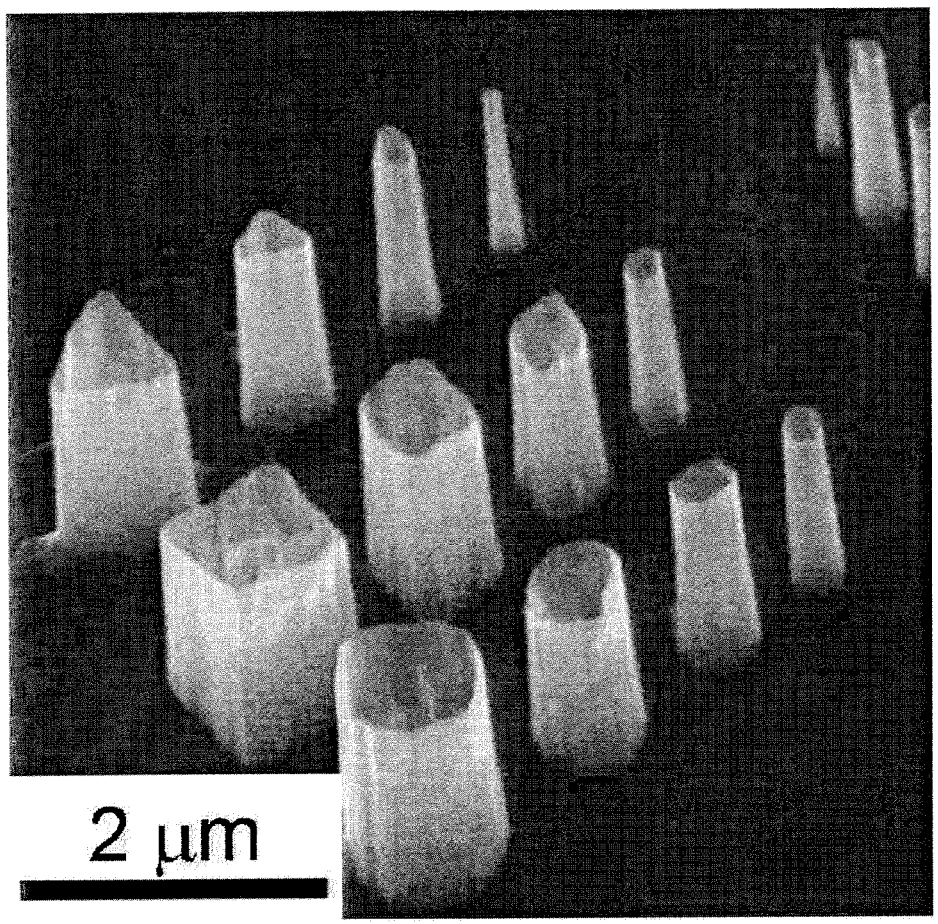

FIG. 21 and FIG. 22 are a plan scanning electron microscopy picture and a solid scanning electron microscopy picture of the nanotubes formed on the seed layer in FIG. 20, respectively. As illustrated in FIG. 21 and FIG. 22, the nanotubes having the triangular, rectangular, and circular shape were formed along an edge of the opening. The nanotubes having the triangular, rectangular, and circular shapes having different sizes were formed by controlling the size of the opening. Thus, the size of the nanotubes was desirably controlled according to Example 1.

Figure 23:
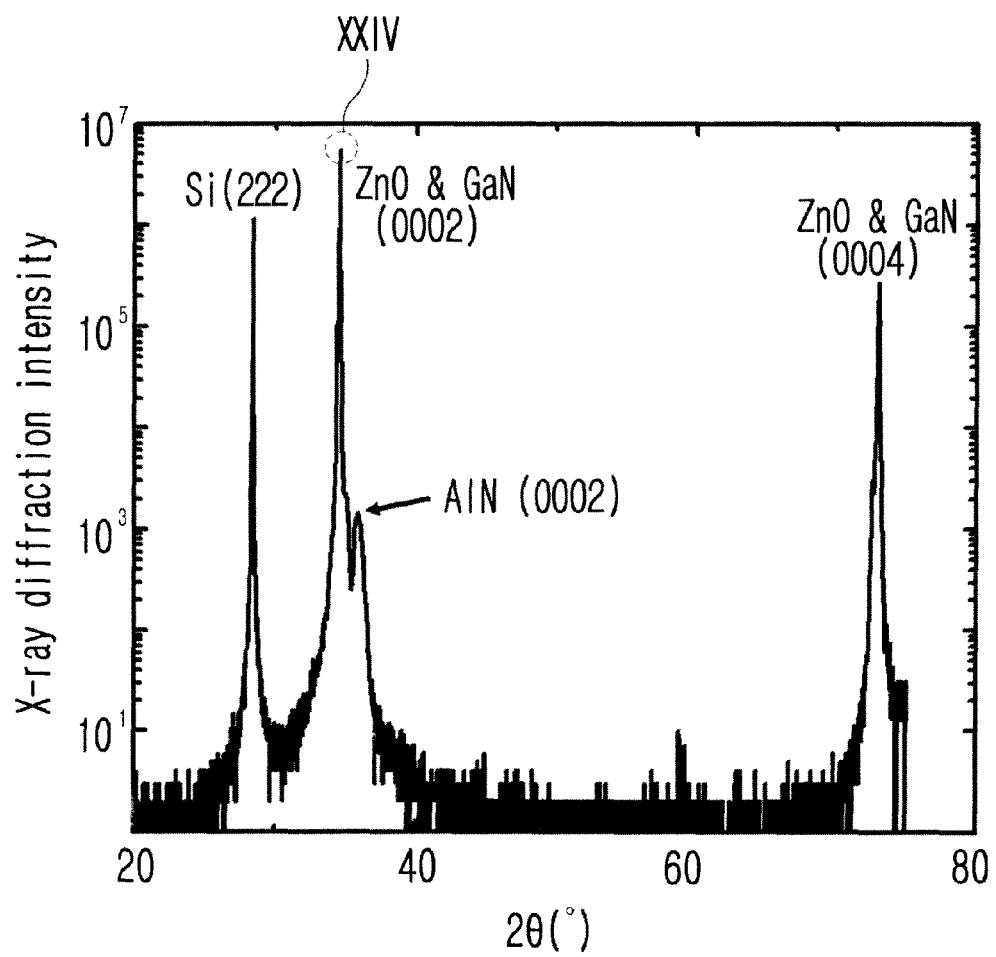
FIG. 23 is an X-ray diffraction graph of a high resolution beam accelerator illustrating an epitaxial relationship between the seed layer and the nanotube.
Figure 24:
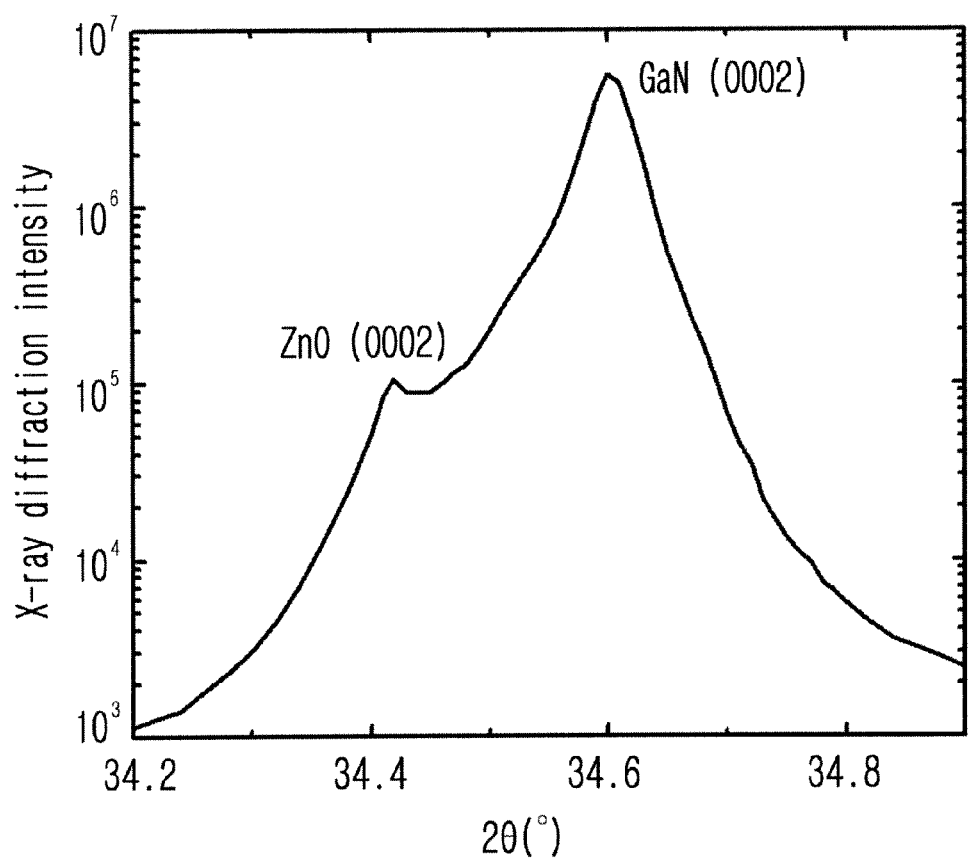
FIG. 24 is a graph showing an enlarged portion of the X-ray diffraction peak corresponding to XXIV portion in the X-ray diffraction graph in FIG. 23.
Figure 25:
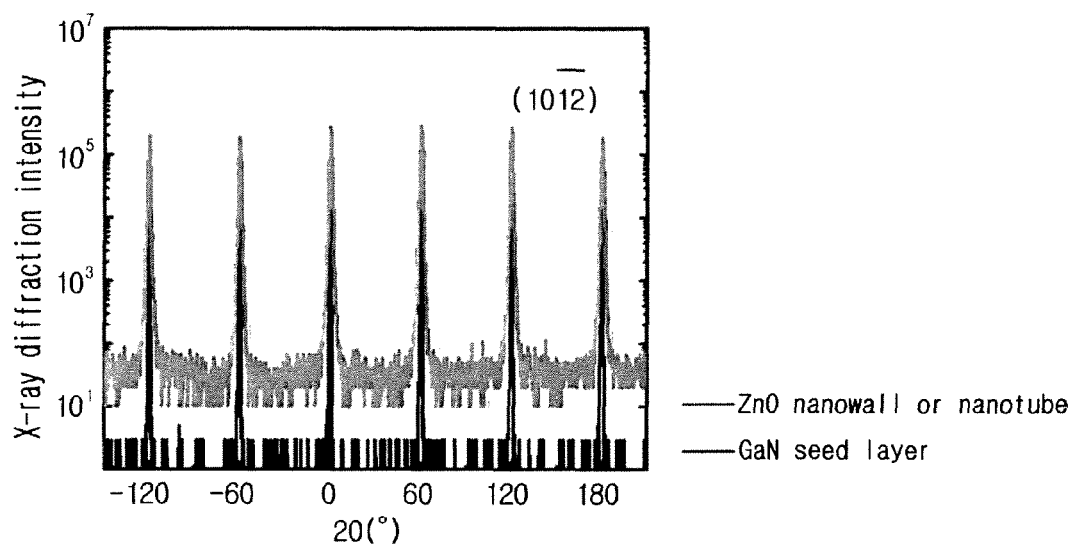
FIG. 25 shows azimuth ($\phi$) scan diffraction intensity illustrating an epitaxial relationship between the seed layer and the nanotube.

FIGS. 23 to 25 are X-ray diffraction graphs of a high resolution beam accelerator illustrating an epitaxial relationship between the seed layer and the nanotubes. Here, a monochromatic light of about 1.54 Å was used as an X-ray.

As illustrated in FIG. 23, X-ray intensity according to a $\omega$-2$\theta$ diffraction scan was analyzed. In this case, a peak of a (111) direction was indicated at a substrate including silicon, and a peak of a (0002) direction was indicated at a buffer layer including aluminum nitride. A peak of a (0004) crystal face was indicated at the seed layer including gallium nitride (GaN) and a nanotube including zinc oxide (ZnO). Thus, the seed layer and the nanotube were arranged along substantially the same direction.

FIG. 24 is a graph of an enlarged a portion of the X-ray diffraction peak corresponding to an XXIV portion of the X-ray diffraction graph in FIG. 23. As illustrated in FIG. 24, a peak of the seed layer including gallium nitride (GaN) was separated from a peak of the nanotube including zinc oxide (ZnO).

FIG. 25 shows azimuth ($\phi$) scan diffraction intensity illustrating an epitaxial relationship between the seed layer and the nanotube.

As illustrated in FIG. 25, when the azimuth was rotated about 360° from the (10$\bar{1}$2) diffraction peak of the seed layer including gallium nitride, six peaks corresponding to {10$\bar{1}$2} were observed. When the azimuth was rotated about 360° from the (10$\bar{1}$2) diffraction peak of the nanotube, a diffraction peak was observed at substantially the same $\phi$ position. This is because the nanotube epitaxially grew on the seed layer.

Figure 26:
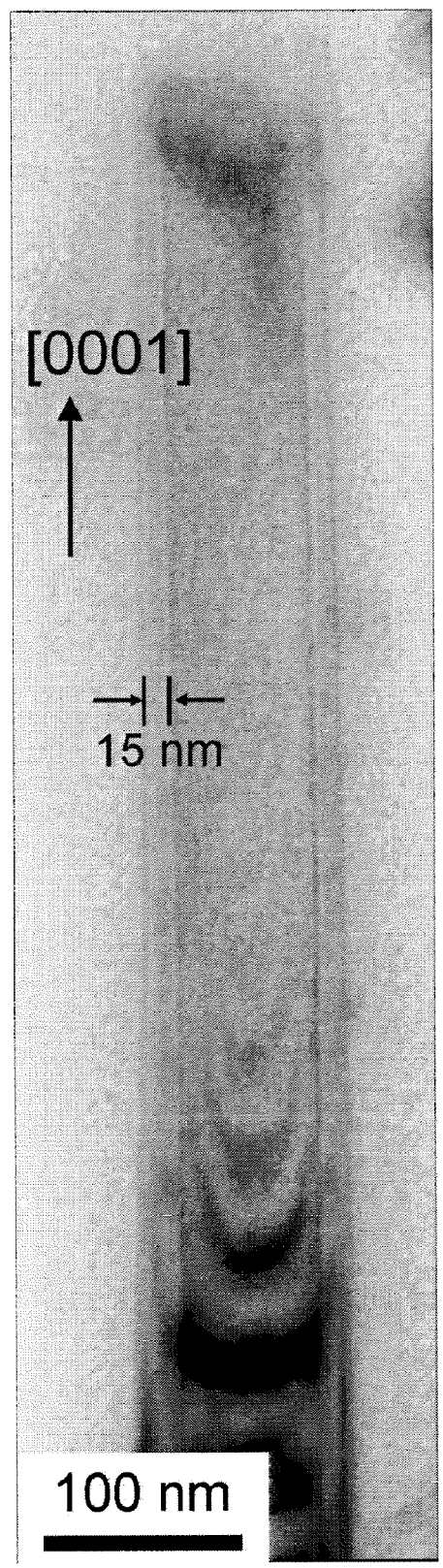
FIGS. 26 to 28 are transmission electron microscope analysis pictures of nanotubes.
Figure 27:
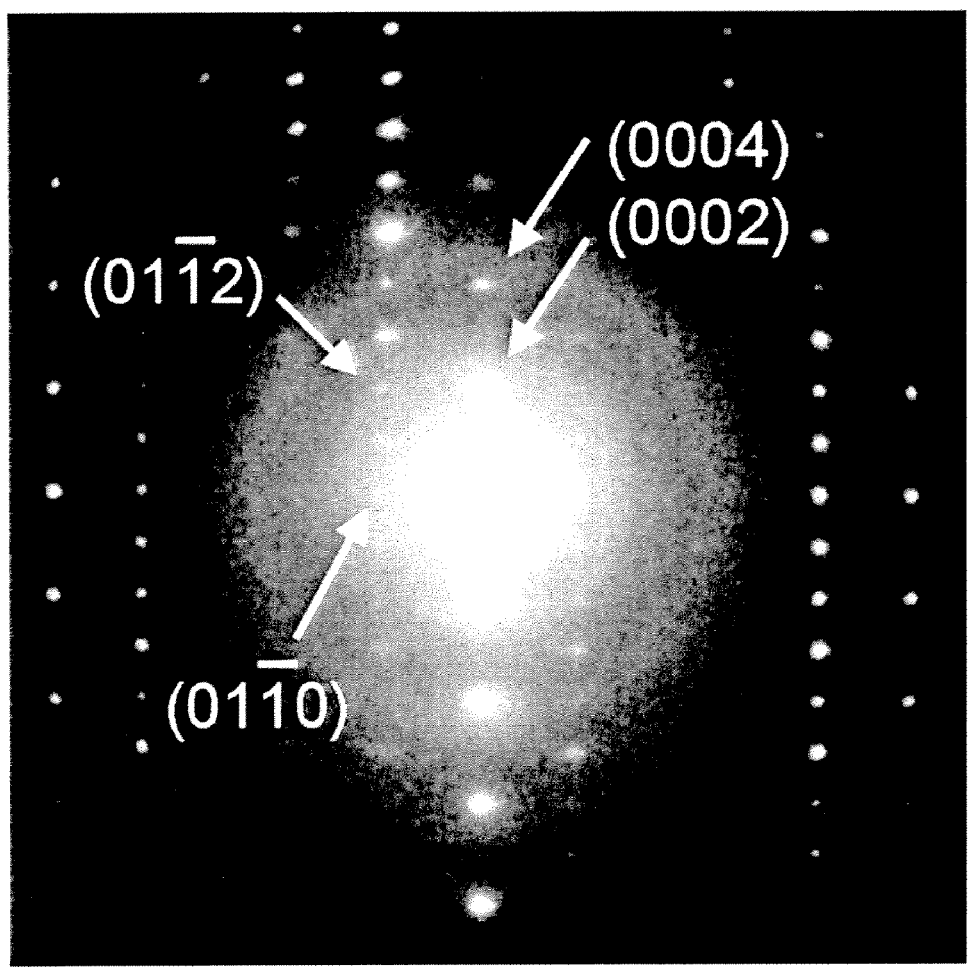
Figure 28:
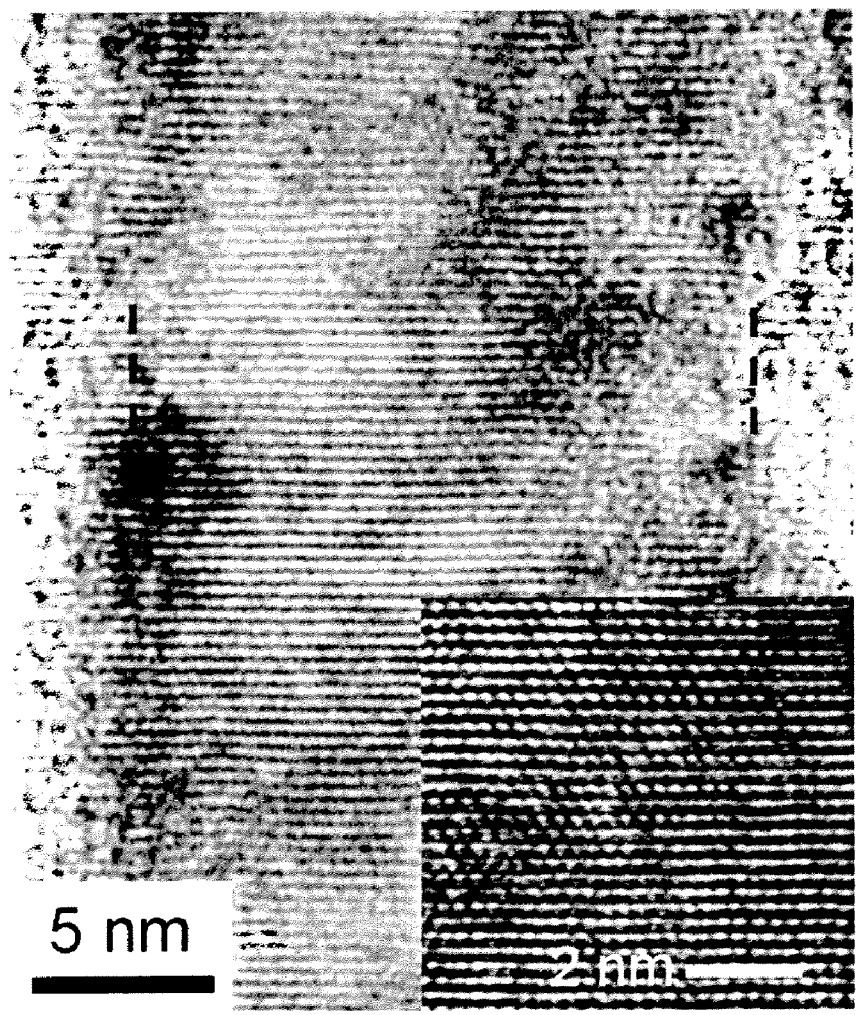

FIGS. 26 to 28 are transmission electron microscope analysis pictures of nanotubes. FIG. 26 is a transmission electron microscope picture of the nanotube, FIG. 27 is a transmission electron microscope analysis picture of an electron diffraction pattern of the nanotube, and FIG. 28 is an enlarged high resolution transmission electron microscope picture.

As illustrated in FIG. 26, the nanotube grew at a relatively uniform thickness of about 15 nm along a predetermined direction. In addition, the electron diffraction pattern of the nanotube in FIG. 27 shows a regular diffraction pattern as a diffraction pattern obtained in FIG. 26. Thus, the grown nanotube was verified as a single crystal. FIG. 27 illustrates a representative diffraction pattern of a crystal face. FIG. 26 and FIG. 27 show that the nanotube [0001] having a single crystal grows in a crystal direction. As illustrated in FIG. 28, a dislocation or a stacking fault was not found in the nanotube. Thus, the manufactured nanotube did not have crystal defects.

Figure 29:
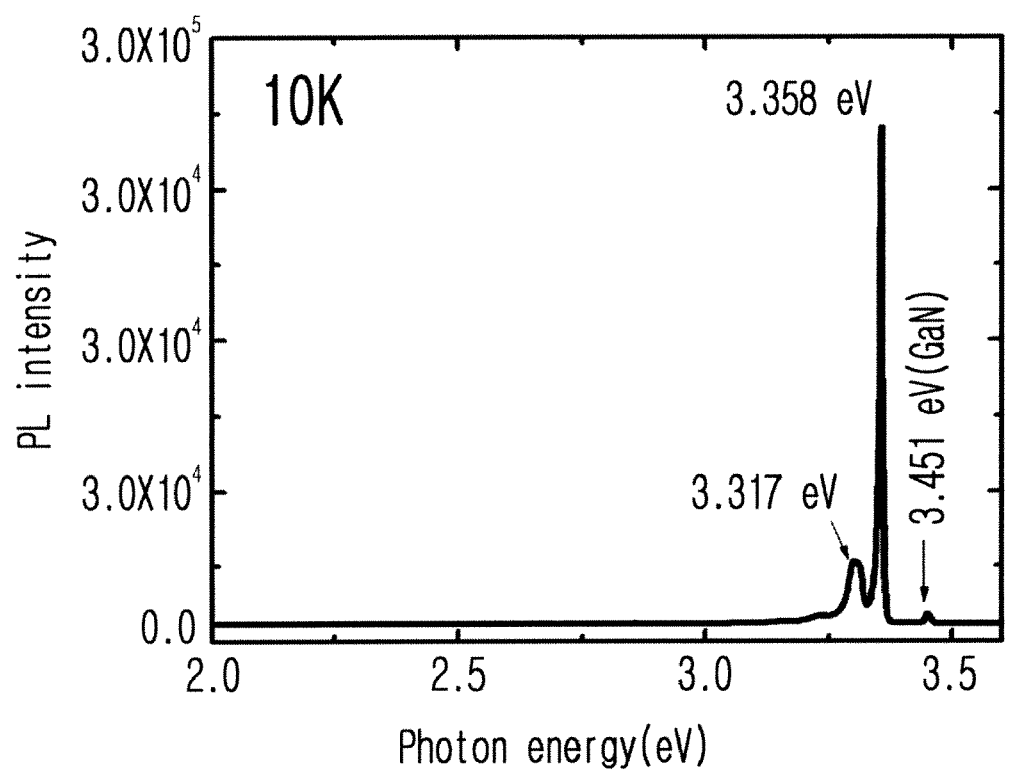
FIG. 29 is a photoluminescence spectrum graph formed by a low temperature and a room temperature photoluminescence spectrum measurement.

FIG. 29 is a photoluminescence spectrum graph formed by low temperature and room temperature photoluminescence spectrum measurement. Here, the low temperature is about 10K.

As illustrated in FIG. 29, main peaks were observed at photon energy positions of 3.29 eV (FIG. 30), 3.317 eV, 3.358 eV, and 3.451 eV by a low temperature photoluminescence spectrum at a temperature of about 10K.

Here, luminescence peaks of about 3.29 eV and 3.317 eV correspond to luminescence due to a donor-acceptor pair transition. In addition, the luminescence peak of 3.358 eV corresponds to luminescence due to an exciton combined with a neutral donor of a nanotube including zinc oxide. The luminescence peak of about 3.451 eV corresponds to luminescence due to an exciton combined with a neutral donor of the seed layer including gallium nitride.

Although a luminescence effective volume of the nanotube including zinc oxide is about 7/1000 times a luminescence effective volume of the seed layer including gallium nitride, intensity of luminescence of the nanotube is superior. This is because a high quality nanotube including a high purity single crystal is formed by a non-catalytic metal organic chemical vapor deposition (MOCVD) process using a high purity precursor and a gas.

Figure 30:
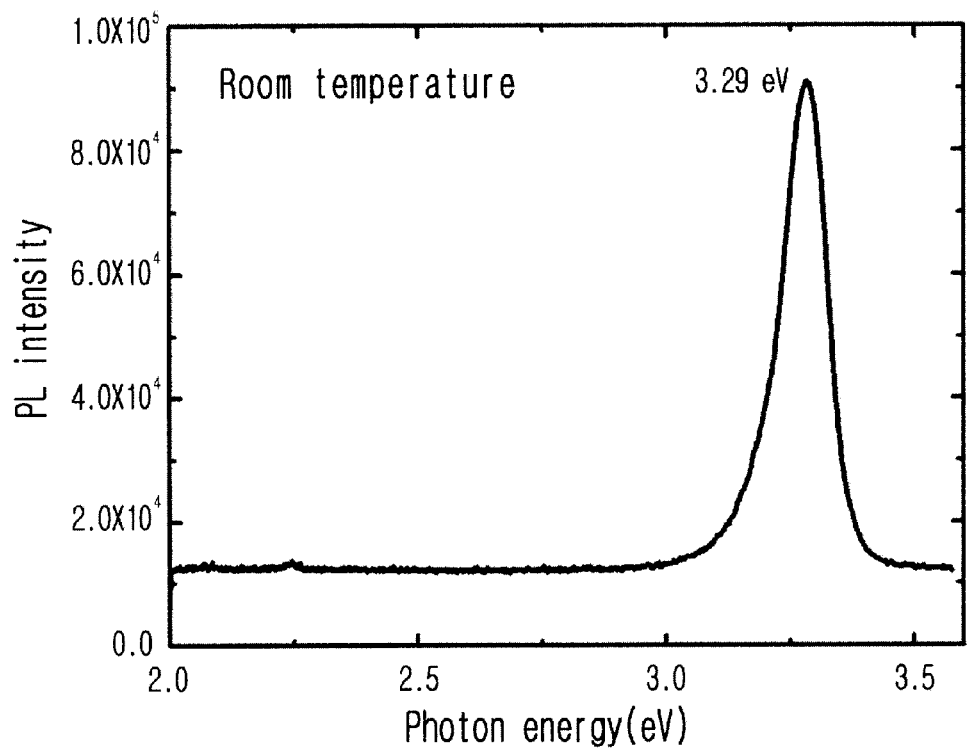
FIG. 30 shows a result of a room temperature photoluminescence spectrum.
Figure 31:
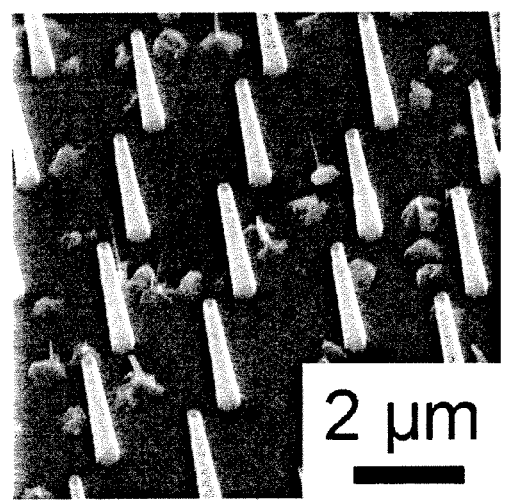
FIGS. 31 to 34 are solid scanning electron microscopy pictures illustrating nanotubes having controlled intervals of 2.4 µm, 1.6 µm, 1.2 µm, and 0.8 µm.
Figure 32:
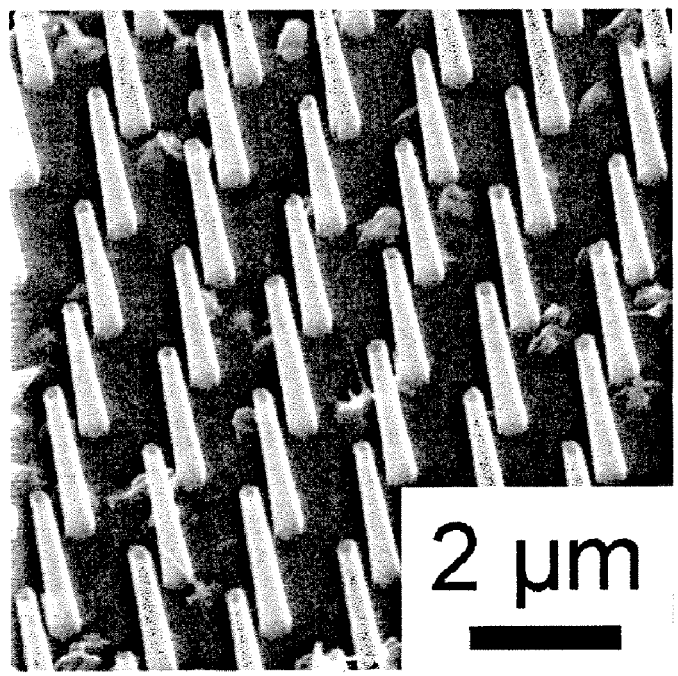
Figure 33:
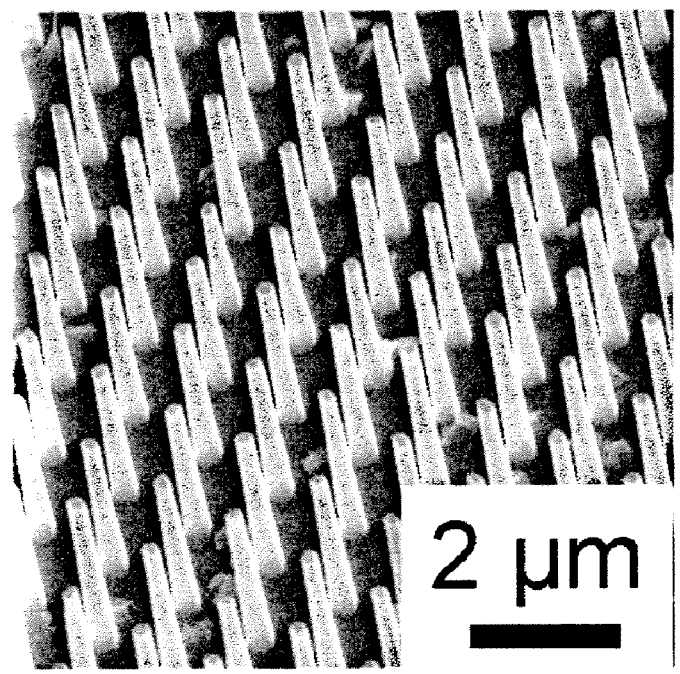
Figure 34:
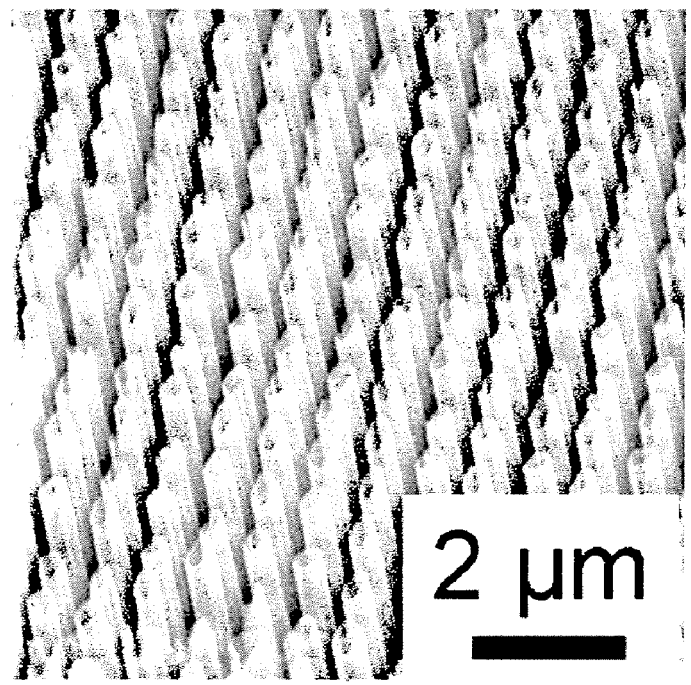
Figure 35:
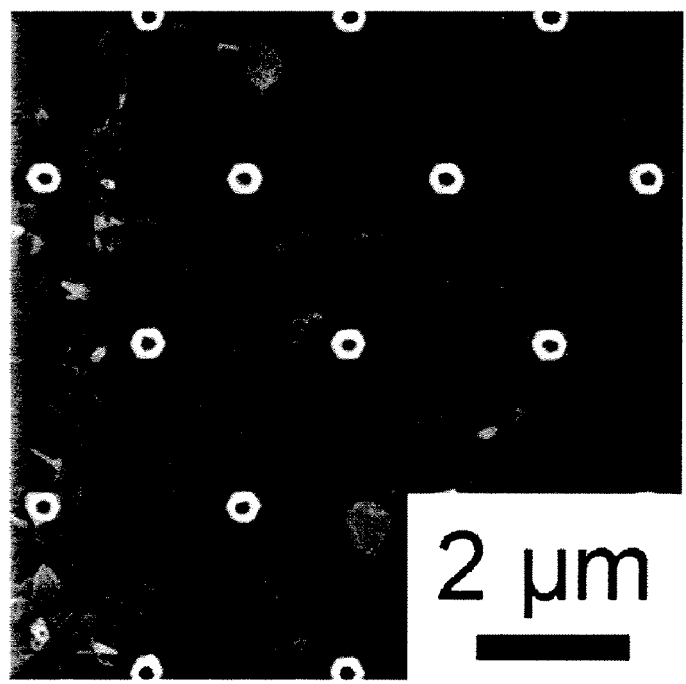
FIGS. 35 to 38 are plan scanning electron microscopy pictures illustrating nanotubes having controlled intervals of 2.4 µm, 1.6 µm, 1.2 µm, and 0.8 µm.
Figure 36:
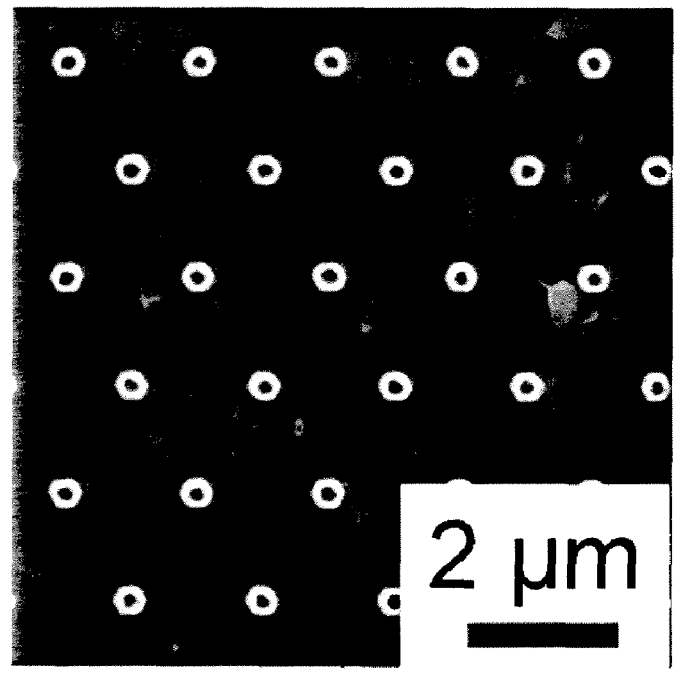
Figure 37:
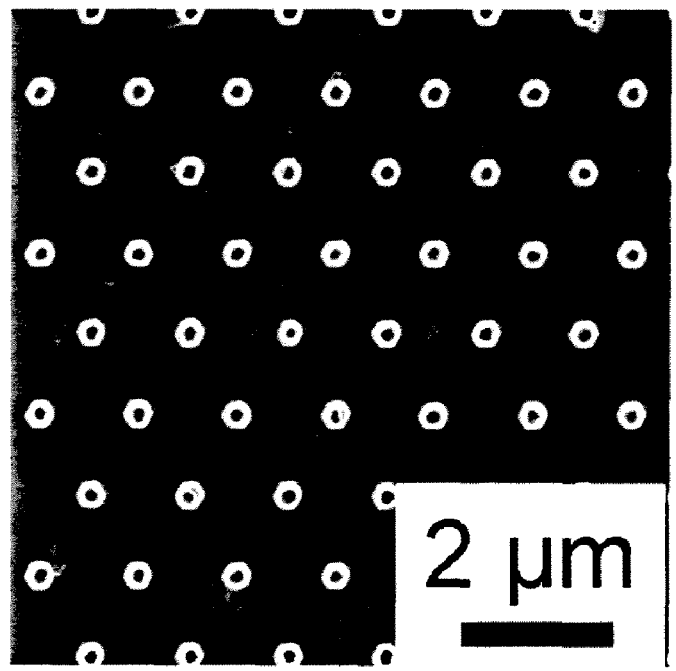
Figure 38:
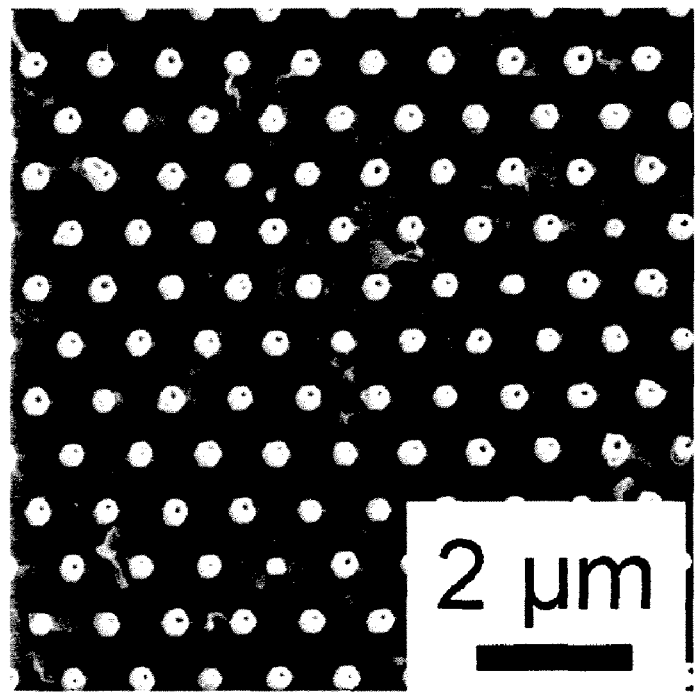
Figure 39:
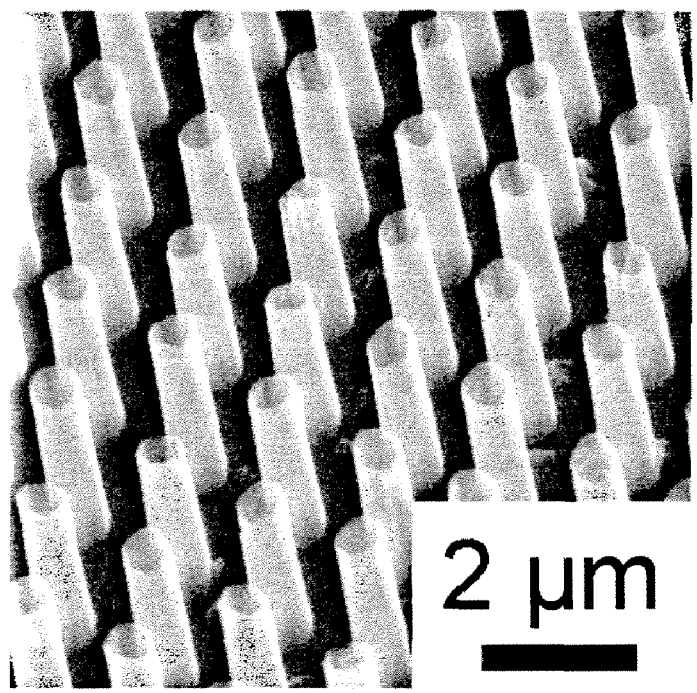
FIGS. 39 to 42 are solid scanning electron microscopy pictures illustrating the nanotubes having controlled diameters of 200 nm, 400 nm, 600 nm, and 800 nm.
Figure 40:
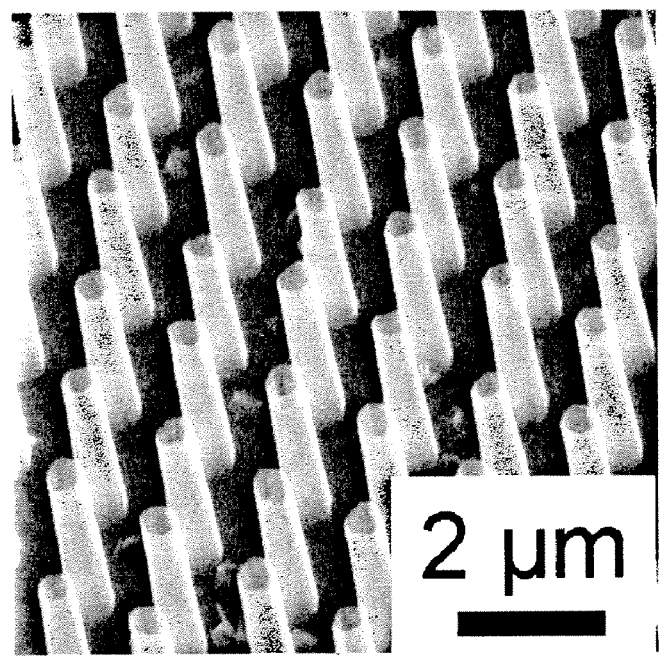
Figure 41:
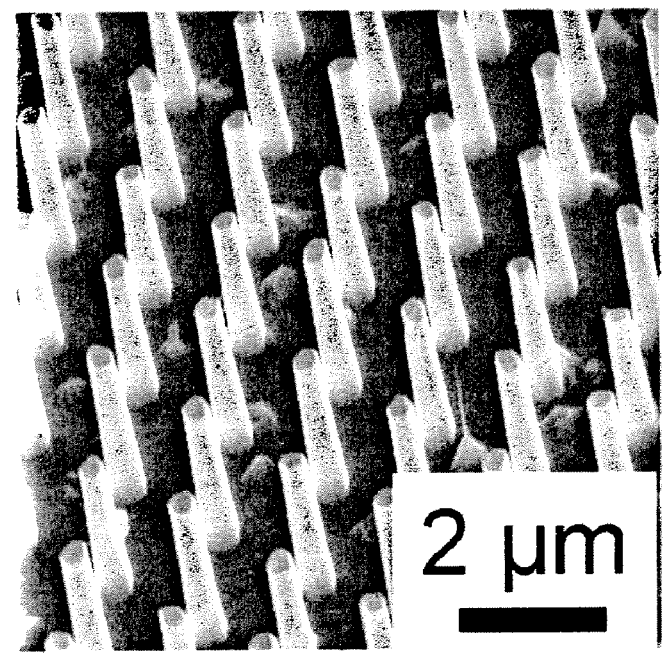
Figure 42:
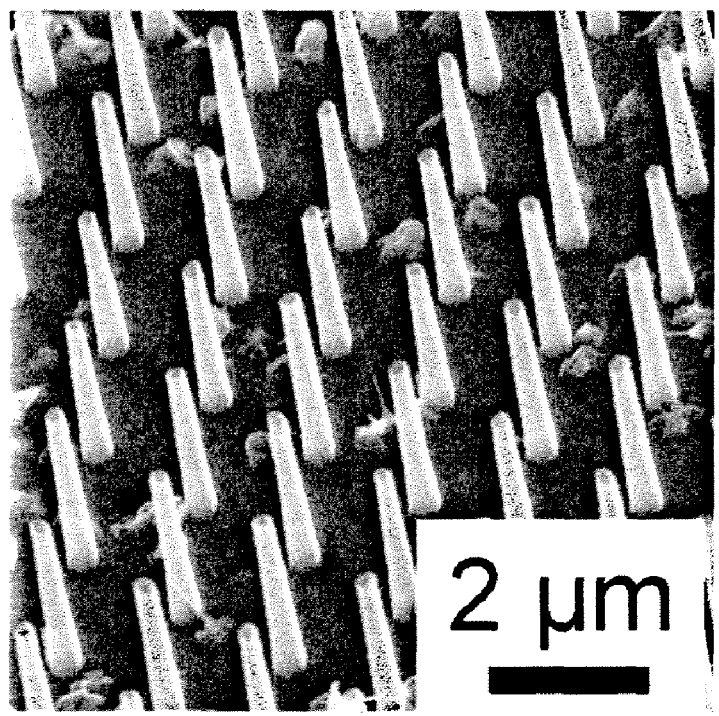
Figure 43:
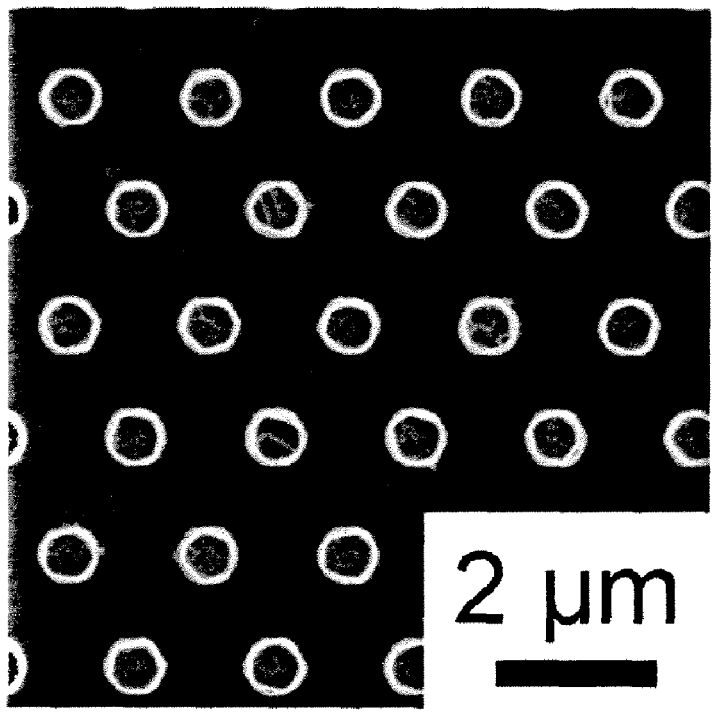
FIG. 43 to FIG. 46 are plan scanning electron microscopy pictures illustrating the nanotubes having controlled diameters of 200 nm, 400 nm, 600 nm, and 800 nm.
Figure 44:
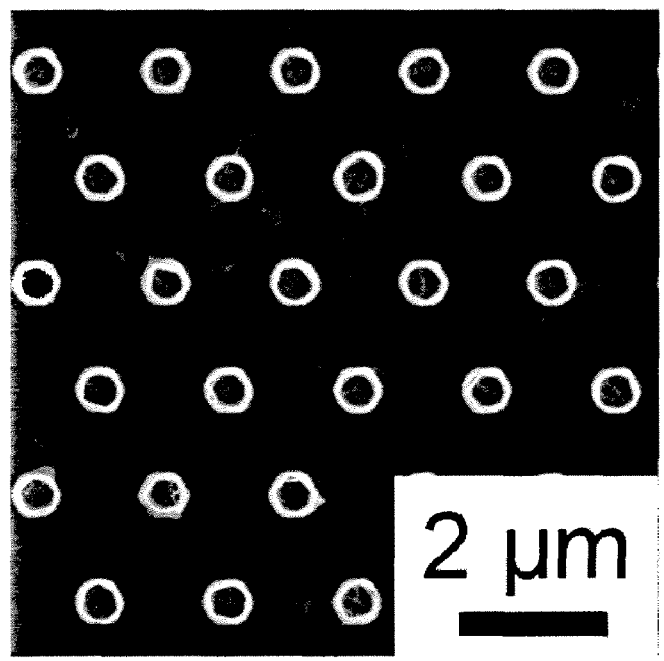
Figure 45:
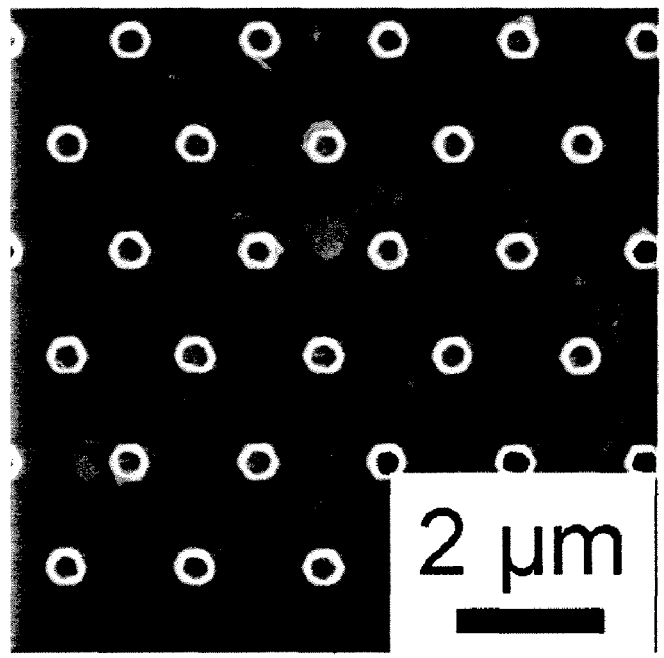
Figure 46:
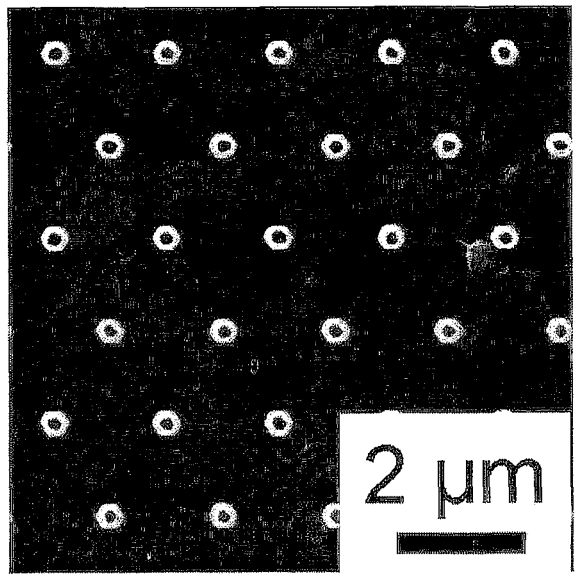

FIG. 30 is a result of a room temperature photoluminescence spectrum. NBE (ear-band-edge luminescence) was observed at about 3.29 eV. In addition, luminescence at about 2.2 ev due to a crystal defect was not observed. Thus, a superior crystalline property of the nanotube was verified.

Example 2

A plurality of nanotubes were formed by processes substantially the same as those in Example 1. Intervals between the openings were controlled in Example 2, and the controlled intervals between the openings in Example 2 were 2.4 μm, 1.6 μm, 1.2 μm, and 0.8 μm so that a plurality of nanotubes having circular cross-sections were formed.

FIGS. 31 to 34 are solid scanning electron microscopy pictures illustrating the nanotubes having controlled intervals of 2.4 μm, 1.6 μm, 1.2 μm, and 0.8 μm. In addition, FIG. 35 to FIG. 38 are plan scanning electron microscopy pictures illustrating the nanotubes having controlled intervals of 2.4 μm, 1.6 μm, 1.2 μm, and 0.8 μm. Thus, FIG. 31 corresponds to FIG. 35, FIG. 32 corresponds to FIG. 36, FIG. 33 corresponds to FIG. 37, and FIG. 34 corresponds to FIG. 38.

As illustrated in FIGS. 31 to 38, intervals between the nanotubes were desirably controlled in Example 2. Thus, a highly integrated nanodevice may be formed by regularly arranging the plurality of nanotubes.

Example 3

The diameter of the nanotube in Example 3 was controlled. The controlled diameter was about 200 nm, 400 nm, 600 nm, and 800 nm. Thus, the plurality of nanotubes having different diameters was formed to have circular cross-sections.

FIGS. 39 to 42 are solid scanning electron microscopy pictures illustrating the nanotubes having controlled diameters of 200 nm, 400 nm, 600 nm, and 800 nm. In addition, FIG. 43 to FIG. 46 are plan scanning electron microscopy pictures illustrating the nanotubes having controlled diameters of 200 nm, 400 nm, 600 nm, and 800 nm. Thus, FIG. 39 corresponds to FIG. 43, FIG. 40 corresponds to FIG. 44, FIG. 41 corresponds to FIG. 45, and FIG. 42 corresponds to FIG. 46.

As illustrated in FIGS. 39 to 42, the diameters of the nanotubes were desirably controlled in Example 3. Thus, a highly integrated nanodevice may be formed by controlling the diameters of the plurality of nanotubes.

Example 4

A nanodevice was manufactured by substantially the same processes as those in Example 1. However, the opening was formed to have a linear shape or a curved line shape so that a nanowall was formed on a seed layer.

Figure 47:
FIG. 47 and FIG. 48 are a plan scanning electron microscopy picture and a solid scanning electron microscopy picture, respectively, of the nanodevice formed in a shape of "POSTECH."
Figure 48:
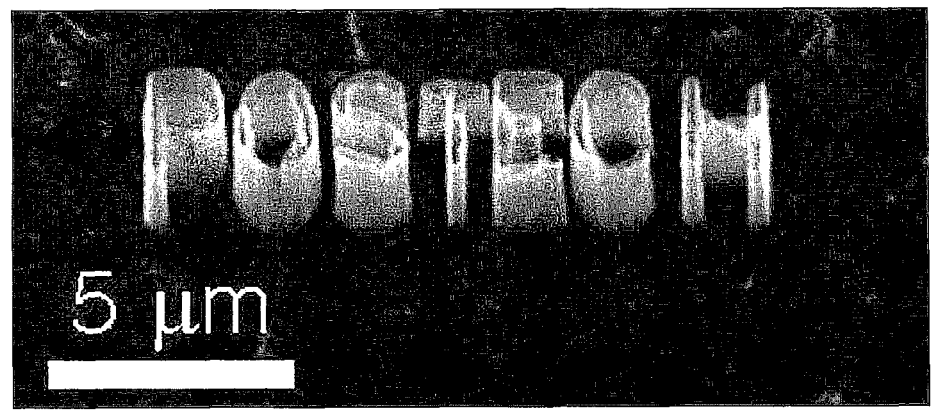

FIG. 47 and FIG. 48 are a plan scanning electron microscopy picture and a solid scanning electron microscopy picture, respectively, of the nanodevice formed in a shape of "POSTECH." As illustrated in FIG. 47 and FIG. 48, a nanowall having a desired shape is formed by forming the opening to having various line shapes. Thus, the location and shape of the nanowall were desirably controlled in Example 4.

Example 5

A nanodevice was manufactured by processes substantially the same as those in Examples 1 to 3. A plurality of nanotubes having a length of about 2.8 μm and a diameter of about 200 μm were formed at a substrate having a size of 800 μm×800 μm. Here, a hexagonal shape was formed by fixing intervals between the nanotubes as 1 μm, 2 μm, 3 μm, 6 μm, 9 μm, and 12 μm, respectively. An electrode was formed at an upper end of the nanotube formed by the above processes, and a power source was connected to the electrode and the substrate. Thus, light emitting devices having nanotubes from which light emits when an electric field was applied were manufactured. Here, the structure of the light emitting device was substantially the same as that of the light emitting device in FIG. 14.

Figure 49:
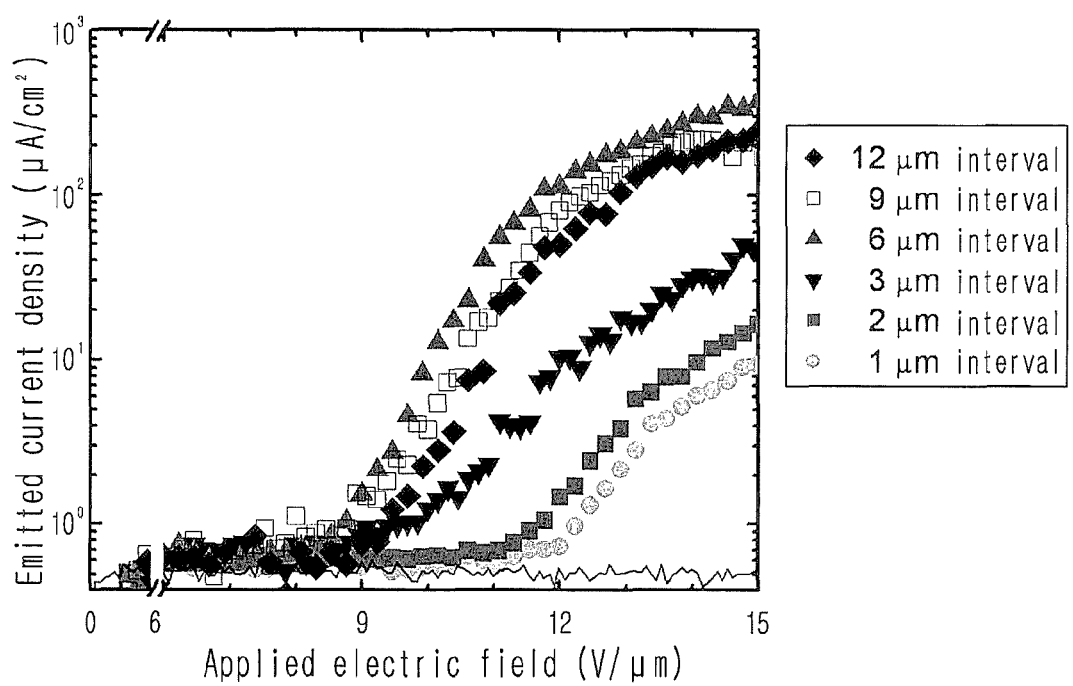
FIG. 49 is a graph illustrating a current density emitted from the light emitting devices when the electric field was applied to the light emitting device.

FIG. 49 is a graph illustrating a current density emitted from the light emitting devices when the electric field was applied to the light emitting device.

As illustrated in FIG. 49, when intervals between the nanotubes increase, an emitted current density increases. Thus, the emitted current density increased until the intervals between the nanotubes became about 6 μm. However, when the intervals between the nanotubes exceedingly increased, the emitted current density decreased.

Figure 50:
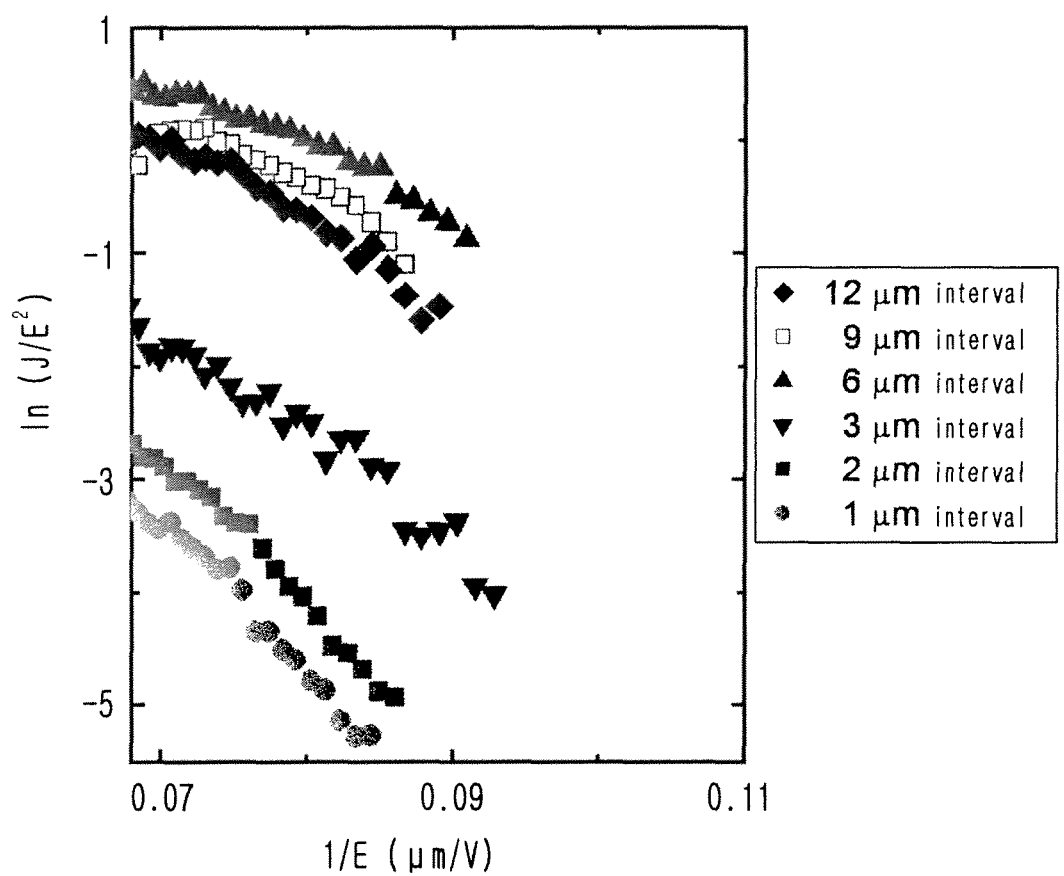
FIG. 50 is a graph showing a Fowler-Nordheim transformed graph of FIG. 49.

FIG. 50 is a graph showing a Fowler-Nordheim transformation of FIG. 49.

As illustrated in FIG. 50, when the intervals between the nanotubes increased, a beta value increased. Here, the beta value is related to a local electric filed applied to the nanotube. When the beta value increased, an emitted current density increased. Thus, electric fiend emission capability of the light emitting device increases according to an increase in the intervals between the nanotubes. Therefore, a light emitting device having relatively large emission efficiency may be formed by controlling the position of the nanotubes.

Figure 51:
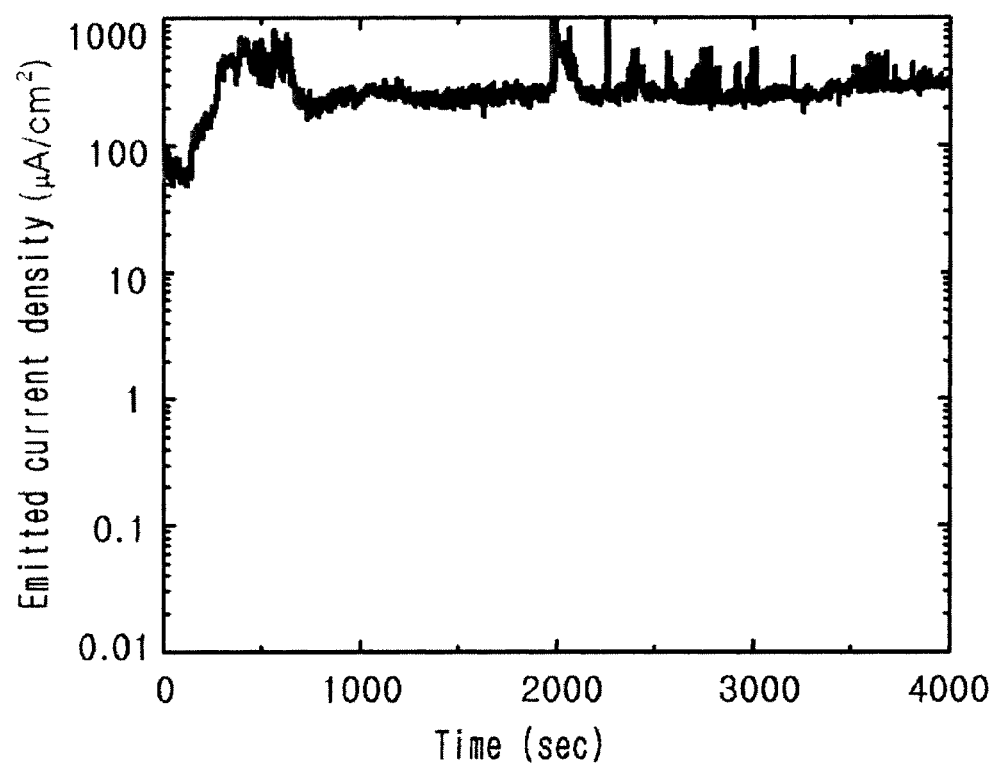
FIG. 51 illustrates stability of an emission current density of a light emitting device including nanotubes having intervals of about 6 µm.

FIG. 51 illustrates stability of emission current density of a light emitting device including nanotubes having intervals of about 6 μm.

FIG. 51 shows results of current density emitted by an electric field of about 10V/μm from an x-axis of FIG. 50 with respect to time. As illustrated in FIG. 51, an emission current density of the light emitting device was constantly maintained for about 4000 seconds. The emission current density of the light emitting device was hardly changed. Thus, stable operation of the light emitting device was verified.

Figure 52:
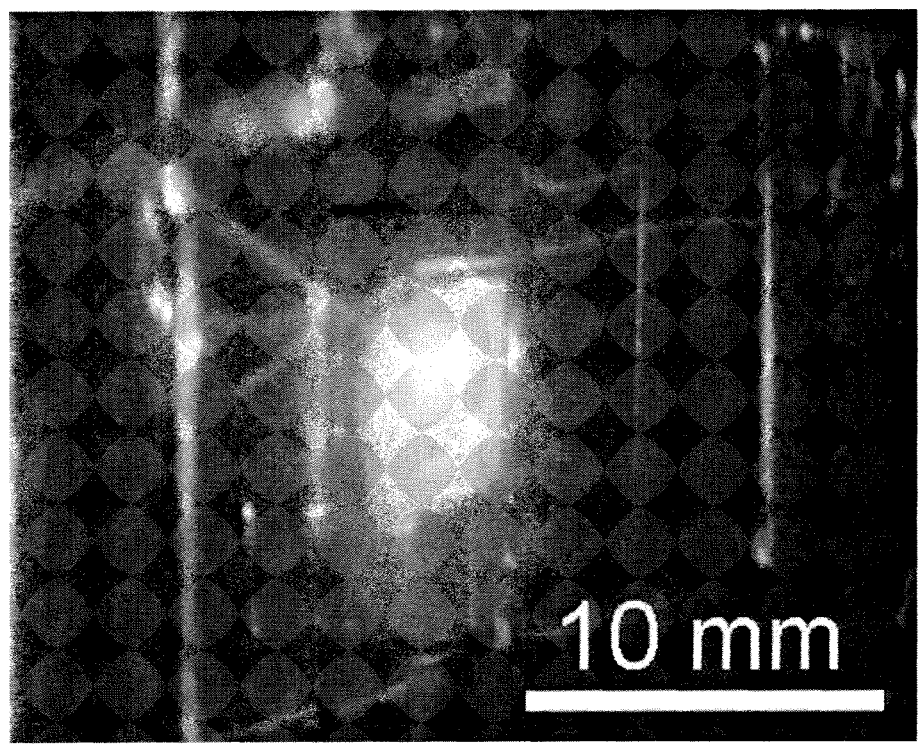
FIG. 52 and FIG. 53 are luminescence pictures of light emitting devices taken at a dark room and a room having lighting, respectively.
Figure 53:
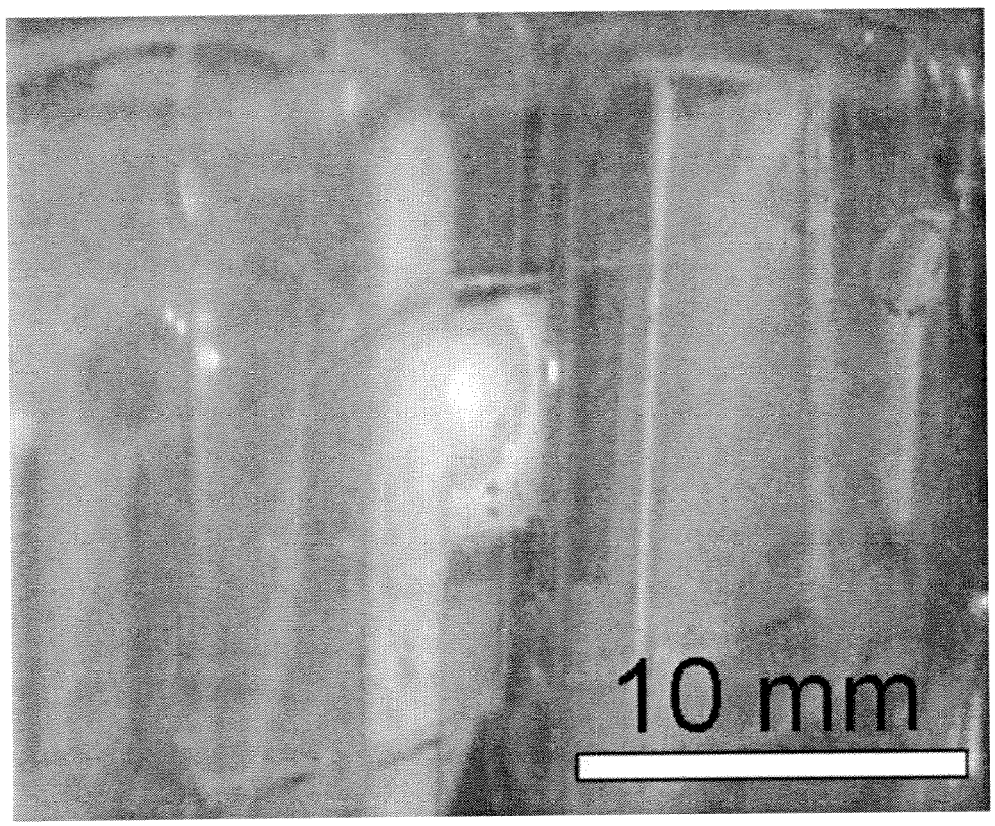

FIG. 52 and FIG. 53 are luminescence pictures of light emitting devices taken in a dark room and a room having light, respectively.

As shown in FIG. 52, the light emitting devices emitted light in the dark room. In addition, as illustrated in FIG. 53, the light emitting devices fully emitted light in the room having light. Thus, the light emitting devices emit the light regardless of place, so the light emitting devices may be employed in a display device.

What is claimed is:

1. A nanodevice comprising:
a substrate;
a mask layer located on the substrate, the mask layer having at least one opening; and
a nanotube formed on the substrate through the opening along an edge of the opening, the nanotube extending through the opening in a direction substantially perpendicular to a surface of the substrate,
wherein the substrate comprises a first substrate portion contacting the nanotube; and
a second substrate portion surrounded by the first substrate portion, and wherein surface energy of the first substrate portion is larger than that of the second substrate portion, and a difference in the surface energy between the first substrate portion and the second substrate portion is about 0.1 J/m² to about 5 J/m².

2. The nanodevice of claim 1, wherein a cross-section of the nanotube in a direction substantially parallel to a surface of the substrate is a circle or a polygon, and the substrate is outwardly exposed through a space.

3. The nanodevice of claim 1, wherein the nanodevice is used as a light emitting device or a bio sensor.

4. The nanodevice of claim 1, wherein the at least one opening includes a plurality of openings, and a distance between the openings is about 10 nm to about 100 μm.

5. The nanodevice of claim 4, wherein the openings have different diameters from one another.

6. The nanodevice of claim 1, further comprising a seed layer located between the substrate and the mask layer, wherein the nanotube contacts the seed layer.

7. The nanodevice of claim 6, wherein the seed layer includes:
a first seed layer portion contacting the nanotube; and
a second seed layer portion enclosed by the first substrate portion.

8. The nanodevice of claim 6, wherein the seed layer includes at least one material selected from the group consisting of silicon, aluminum oxide, gallium arsenide, spinel, silicon, indium phosphide, gallium phosphate, aluminum phosphate, gallium nitride, indium nitride, aluminum nitride, zinc oxide, magnesium oxide, silicone carbide, and titanium oxide, and the nanotube includes at least one material selected from the group consisting of gallium nitride and zinc oxide.

9. The nanodevice of claim 1, wherein a crystal structure of the substrate is substantially the same as that of the nanotube.

10. The nanodevice of claim 9, wherein the nanotube includes at least one material selected from the group consisting of zinc oxide (ZnO), zinc magnesium oxide (ZnMgO), zinc cadmium oxide (ZnCdO), zinc beryllium oxide (ZnBeO), and zinc magnesium beryllium oxide (ZnMgBeO).

11. The nanodevice of claim 9, wherein the substrate includes silicon, aluminum oxide, gallium arsenide, spinel, silicon, indium phosphide, gallium phosphate, indium aluminum, gallium nitride, indium nitride, aluminum nitride, zinc oxide, magnesium oxide, silicone carbide, titanium oxide, quartz, pyrex, a polymer, and a metal.

12. A nanodevice comprising:
a substrate;
a mask layer located on the substrate, the mask layer having at least one opening;
a nanowall formed on the substrate through the opening, the nanowall extending through the opening in a direction substantially perpendicular to a surface of the substrate,
wherein the substrate comprises a first substrate portion contacting the nanowall; and
a second substrate portion surrounded by the first substrate portion, wherein surface energy of the first substrate portion is larger than that of the second substrate portion, and a difference in the surface energy between the first and second substrate portions is about 0.1 J/m$^2$ to about 5 J/m$^2$.

13. The nanodevice of claim 12, wherein the at least one opening includes a plurality of openings, the plurality of openings includes a first opening and a second opening, and the first opening and the second opening are crossed.

14. The nanodevice of claim 12, further comprising a seed layer located between the substrate and the mask layer, wherein the nanowall contacts the seed layer.

15. The nanodevice of claim 14, wherein the seed layer includes a first seed layer portion contacting the nanowall, and a second seed layer portion enclosed by the first substrate portion.

16. A transistor comprising:
a source electrode;
a mask layer located on the source electrode, the mask layer having at least one opening;
a plurality of nanotubes formed on the source electrode through the opening along an edge of the opening, the nanotubes extending through the opening in a direction substantially perpendicular to a surface of the source electrode;
an insulating layer formed between the plurality of nanotubes;
a dielectric layer covering an upper portion of the insulating layer and a surface of the nanotubes;
a gate electrode formed inside the nanotubes to cover the dielectric layer; and
a drain electrode located on the gate electrode,
wherein the source electrode comprises a first source electrode portion contacting the plurality of nanotubes and a second source electrode portion enclosed by the first source electrode portion, and
wherein surface energy of the first source electrode portion is larger than that of the second source electrode portion, and a difference in the surface energy between the first and second source electrode portions is about 0.1 J/m$^2$ to about 5 J/m$^2$.

17. A method of manufacturing a nanodevice, the method comprising:
providing a substrate;
forming a mask layer on the substrate, the mask layer having at least one opening; and
allowing a nanotube to grow on the substrate along an edge of the opening through the opening,
wherein the nanotube grows in a direction substantially perpendicular to a surface of the substrate,
wherein the substrate includes a first substrate portion from which the nanotube contacting the first substrate portion grows, and a second substrate portion enclosed by the first substrate portion, and
wherein surface energy of the first substrate portion is larger than that of the second substrate portion, and a difference in the surface energy between the first substrate portion and the second substrate portion is about 0.1 J/m$^2$ to about 5 J/m$^2$.

18. The method of claim 17, further comprising forming a seed layer between the substrate and the mask layer, wherein the nanotube grows directly on the seed layer.

19. The method of claim 18, wherein the seed layer includes a first seed layer portion from which the nanotube contacting the first seed layer portion grows, and a second seed layer portion enclosed by the first seed layer portion.

20. A method of manufacturing a nanodevice, the method comprising:
providing a substrate;
forming a mask layer on the substrate, the mask layer having at least one linear opening; and
allowing a nanowall to grow on the substrate through the opening,
wherein the nanowall grows in a direction substantially perpendicular to a surface of the substrate,
wherein the substrate includes a first substrate portion from which the nanowall contacting the first substrate portion grows, and a second substrate portion enclosed by the first substrate portion, and
wherein surface energy of the first substrate portion is larger than that of the second substrate portion, and a difference in the surface energy between the first and second substrate portions is about 0.1 J/m$^2$ to about 5 J/m$^2$.

21. The method of claim 20, further comprising forming a seed layer between the substrate and the mask layer, wherein the nanowall grows directly on the seed layer.

22. The method of claim 21, wherein the seed layer comprises a first seed layer portion from which the nanotube contacting the first seed layer portion grows, and a second seed layer portion enclosed by the first seed layer portion.

23. A method of manufacturing a transistor comprising:
providing a source electrode;
forming a mask layer on the source electrode, the mask layer having at least on opening;
allowing a plurality of nanotubes to grow through the opening along an edge of the opening;
forming an insulating film between the plurality of nanotubes;
forming a dielectric layer to cover an upper portion of the insulating layer and a surface of the nanotubes;
forming a gate electrode by covering the inside of the nanotubes with the dielectric layer; and
forming a drain electrode on the gate electrode,
wherein the nanotubes grow in a direction substantially perpendicular to a surface of a substrate,
wherein the substrate comprises a first substrate portion from which the nanotubes contacting the first substrate portion grow, and a second substrate portion enclosed by the first substrate portion, and
wherein surface energy of the first substrate portion is larger than that of the second substrate portion, and a difference in the surface energy between the first and second substrate portions is about 0.1 $J/m^2$ to about 5 $J/m^2$.

24. The method of claim 23, further comprising forming a seed layer between the substrate and the mask layer, wherein the nanotubes grows directly on the seed layer.

25. The method of claim 24, wherein the seed layer comprises a first seed layer portion from which the nanotubes contacting the first seed layer portion grow, and a second seed layer portion enclosed by the first seed layer portion.

* * * * *